US011652068B2

(12) United States Patent
Shim

(10) Patent No.: US 11,652,068 B2
(45) Date of Patent: May 16, 2023

(54) VERTICAL MEMORY DEVICES WITH BENDING PREVENTION LAYERS

(71) Applicant: SAMSUNG ELECTRONICS CO., LTD., Suwon-si (KR)

(72) Inventor: Sunil Shim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/834,168

(22) Filed: Mar. 30, 2020

(65) Prior Publication Data

US 2020/0402923 A1    Dec. 24, 2020

(30) Foreign Application Priority Data

Jun. 21, 2019  (KR) .................. 10-2019-0074144

(51) Int. Cl.
| | |
|---|---|
| *H01L 27/11573* | (2017.01) |
| *H01L 27/1157* | (2017.01) |
| *H01L 23/00* | (2006.01) |
| *H01L 23/535* | (2006.01) |
| *H01L 27/11524* | (2017.01) |
| *H01L 27/11529* | (2017.01) |

(Continued)

(52) U.S. Cl.
CPC ......... *H01L 23/562* (2013.01); *H01L 23/535* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01)

(58) Field of Classification Search
CPC ................ H01L 23/562; H01L 27/115–11597
See application file for complete search history.

(56) References Cited

U.S. PATENT DOCUMENTS

| | | |
|---|---|---|
| 7,812,453 B2 | 10/2010 | Kiyota |
| 8,237,280 B2 | 8/2012 | Kiyota |
| 8,659,122 B2 | 2/2014 | Matsumura |

(Continued)

FOREIGN PATENT DOCUMENTS

| | | |
|---|---|---|
| JP | 3463961 | 8/2003 |
| JP | 20080198784 | 8/2008 |

(Continued)

OTHER PUBLICATIONS

European search report dated Nov. 2, 2020 issued in corresponding European Patent Application No. 20180147.9.

*Primary Examiner* — Didarul A Mazumder
*Assistant Examiner* — Gustavo G Ramallo
(74) *Attorney, Agent, or Firm* — F. Chau & Associates, LLC

(57) ABSTRACT

A vertical memory device including: a circuit pattern on a first substrate; an insulating interlayer on the first substrate, the insulating interlayer covering the circuit pattern; a bending prevention layer on the insulating interlayer, the bending prevention layer extending in a first direction substantially parallel to an upper surface of the first substrate; a second substrate on the bending prevention layer; gate electrodes spaced apart from each other in a second direction on the second substrate, the second direction being substantially perpendicular to the upper surface of the first substrate; and a channel extending through the gate electrodes in the second direction.

20 Claims, 28 Drawing Sheets

(51) Int. Cl.
*H01L 27/11556* (2017.01)
*H01L 27/11582* (2017.01)

(56) References Cited

U.S. PATENT DOCUMENTS

| | | | |
|---|---|---|---|
| 9,548,316 | B2 | 1/2017 | Lim et al. |
| 9,881,868 | B2 | 1/2018 | Tokumitsu et al. |
| 10,115,632 | B1 | 10/2018 | Masamori et al. |
| 10,115,667 | B2 | 10/2018 | Yun et al. |
| 2006/0284231 | A1* | 12/2006 | Natsume ................ H01L 28/57 257/532 |
| 2014/0043902 | A1 | 2/2014 | Unno |
| 2015/0249010 | A1 | 9/2015 | Kubota |
| 2017/0011996 | A1* | 1/2017 | Lee .................... H01L 27/1157 |
| 2017/0256558 | A1* | 9/2017 | Zhang ................. H01L 27/1207 |
| 2017/0365553 | A1 | 12/2017 | Tokumitsu et al. |
| 2019/0081062 | A1* | 3/2019 | Wada ................ H01L 21/76805 |
| 2019/0172840 | A1 | 6/2019 | Song et al. |

FOREIGN PATENT DOCUMENTS

| | | |
|---|---|---|
| JP | 4776841 | 9/2011 |
| JP | 20150088585 | 10/2013 |
| JP | 5601566 | 10/2014 |

\* cited by examiner

VERTICAL MEMORY DEVICES WITH BENDING PREVENTION LAYERS

CROSS-REFERENCE TO RELATED APPLICATION

This application claims priority under 35 U.S.C. § 119 to Korean Patent Application No. 10-2019-0074144, filed on Jun. 21, 2019 in the Korean Intellectual Property Office (KIPO), the disclosure of which is incorporated by reference herein in its entirety.

1. Technical Field

Exemplary embodiments of the inventive concept relate to a vertical memory device.

2. Description of the Related Art

A VNAND flash memory device may include horizontal layers of memory cells stacked in a vertical direction. In a VNAND flash memory device, as the number of gate electrodes stacked in a vertical direction increases, the substrate may be bent more easily. In this case, however, the VNAND flash memory device may not have uniform electrical characteristics.

SUMMARY

According to exemplary embodiments of the inventive concept, there is provided a vertical memory device including: a circuit pattern on a first substrate; an insulating interlayer on the first substrate, the insulating interlayer covering the circuit pattern; a bending prevention layer on the insulating interlayer, the bending prevention layer extending in a first direction substantially parallel to an upper surface of the first substrate; a second substrate on the bending prevention layer; gate electrodes spaced apart from each other in a second direction on the second substrate, the second direction being substantially perpendicular to the upper surface of the first substrate; and a channel extending through the gate electrodes in the second direction.

According to exemplary embodiments of the inventive concept, there is provided a vertical memory device including: a circuit pattern on a first substrate, the first substrate including a cell region and a peripheral circuit region adjacent to the cell region; a first insulating interlayer on the first substrate, the first insulating interlayer covering the circuit pattern; a first bending prevention layer on the first insulating interlayer on the cell region and the peripheral circuit region; a second substrate on the first bending prevention layer on the cell region; gate electrodes spaced apart from each other in a first direction on the second substrate on the cell region, the first direction substantially perpendicular to an upper surface of the first substrate; a channel extending through the gate electrodes in the first direction on the cell region; and a first contact plug extending in the first direction through the first bending prevention layer on the peripheral circuit region, the first contact plug being electrically connected to the circuit pattern.

According to exemplary embodiments of the inventive concept, there is provided a vertical memory device including: transistors on a first substrate; lower wirings on the first substrate, the lower wirings being electrically connected to the transistors; a first insulating interlayer on the first substrate, the first insulating interlayer covering the transistors and the lower wirings; a bending prevention layer on the first insulating interlayer, the bending prevention layer extending in a first direction substantially parallel to an upper surface of the first substrate; a second substrate on the bending prevention layer, gate electrodes spaced apart from each other in a second direction on the second substrate, the second direction being substantially perpendicular to the upper surface of the first substrate; a second insulating interlayer on the second substrate, the second insulating interlayer covering sidewalls of the gate electrodes; channels extending through the gate electrodes in the second direction; upper wirings on the gate electrodes, the upper wirings being electrically connected to the gate electrodes; a first contact plug structure extending through the gate electrodes, the second substrate and the bending prevention layer, the first contact plug structure being electrically connected to a first lower wiring of the lower wirings; and a second contact plug extending through the second insulating interlayer and the bending prevention layer, the second contact plug being electrically connected to a second lower wiring of the lower wirings.

According to an exemplary embodiment of the inventive concept, there is provided a vertical memory device including: a circuit pattern on a first substrate; an insulating interlayer on the first substrate, the insulating interlayer covering the circuit pattern; a bending prevention layer on the insulating interlayer, the bending prevention layer including a plurality of protrusions and recesses; a second substrate on the bending prevention layer; gate electrodes stacked in a first direction substantially perpendicular to an upper surface of the first substrate; and a channel extending through the gate electrodes in the first direction.

DETAILED DESCRIPTION OF THE EMBODIMENTS

Vertical memory devices and methods of manufacturing the same in accordance with exemplary embodiments of the inventive concept will be described more fully hereinafter with reference to the accompanying drawings.

Figure 1:
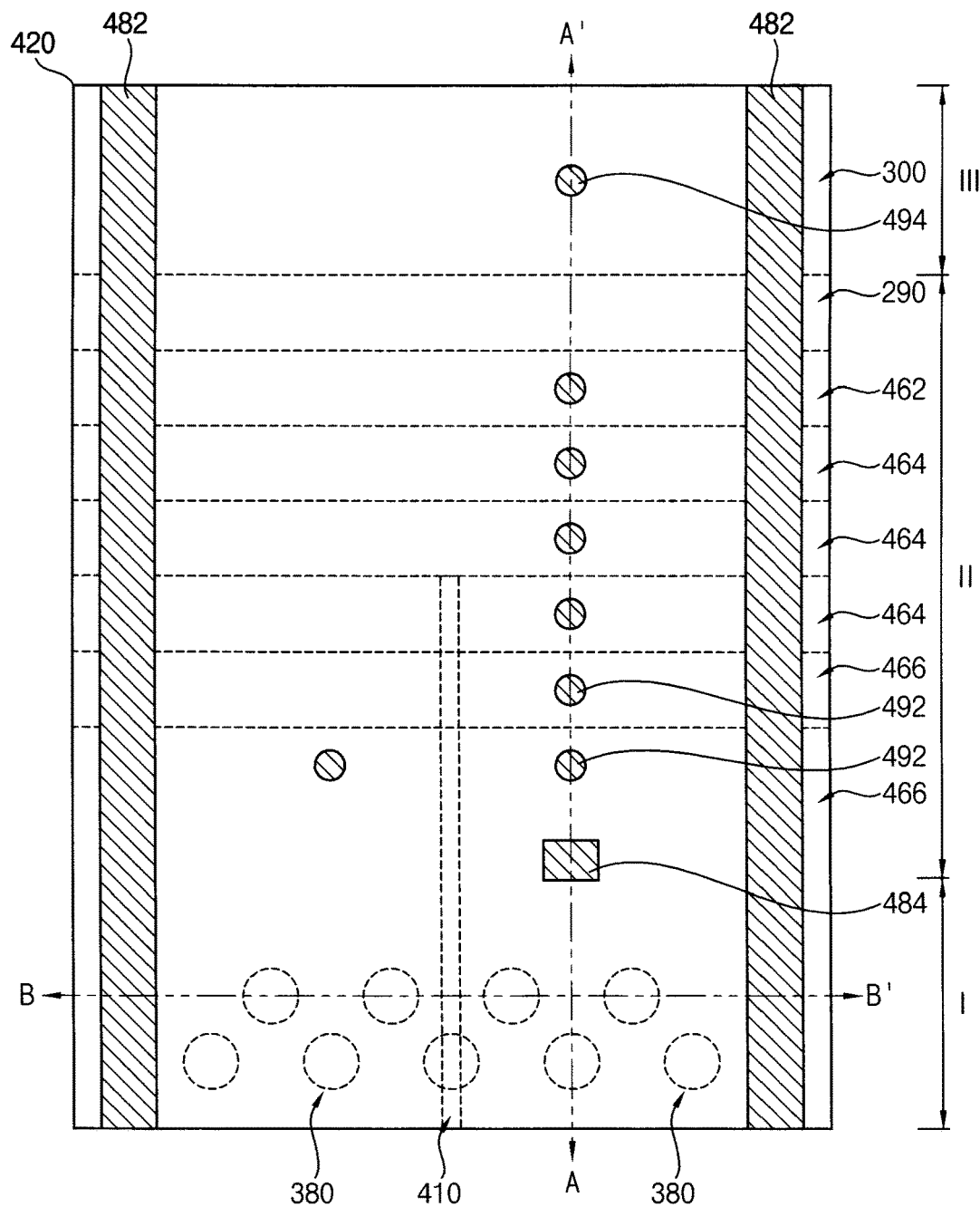
FIGS. 1, 2, 3 and 4 are plan views and cross-sectional views illustrating a vertical memory device in accordance with exemplary embodiments of the inventive concept.
Figure 2:
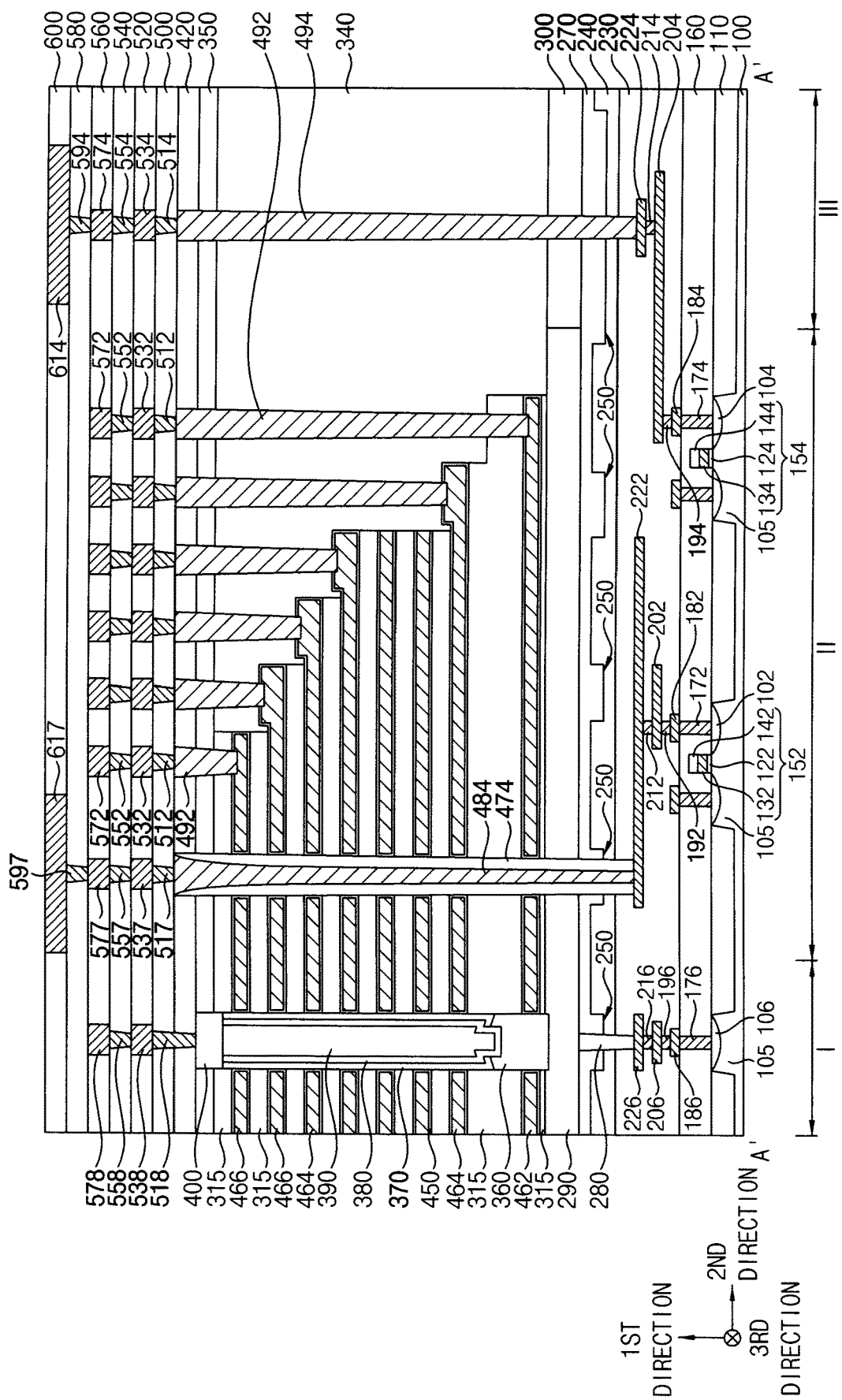
Figure 3:
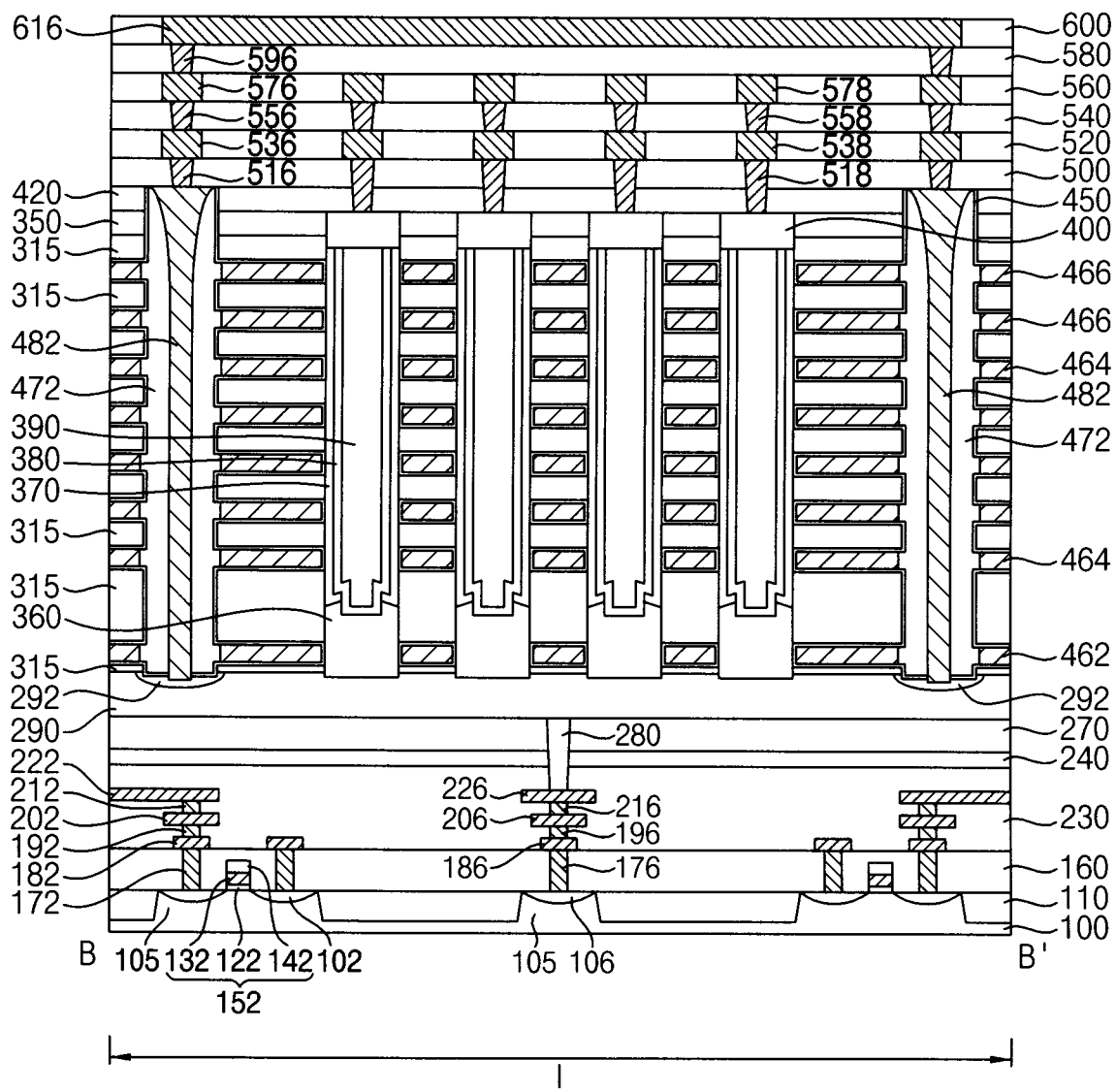
Figure 4:
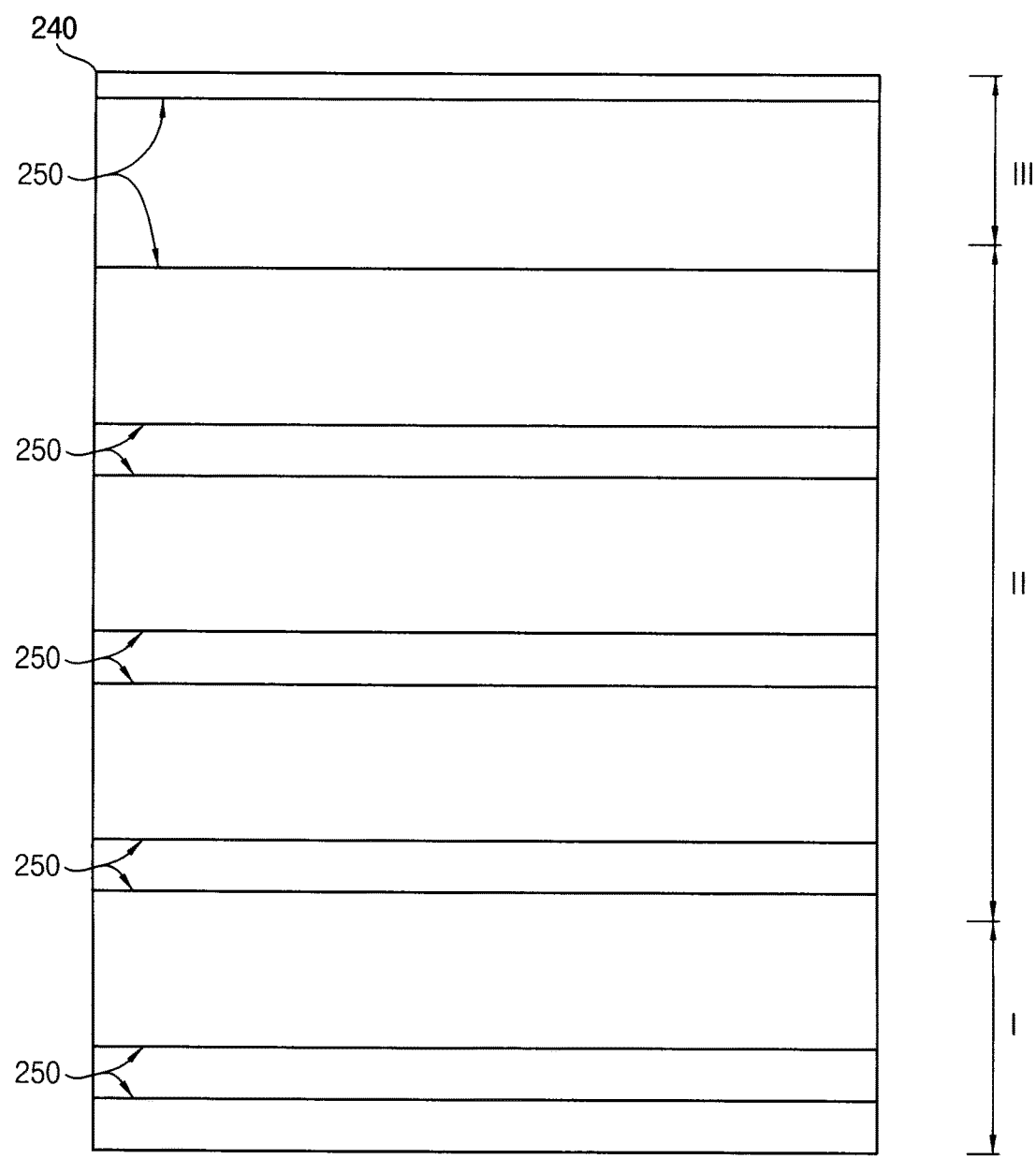

FIGS. 1 to 4 are plan views and cross-sectional views illustrating a vertical memory device in accordance with exemplary embodiments of the inventive concept. Particularly, FIGS. 1 and 4 are the plan views, and FIGS. 2 and 3 are the cross-sectional views.

FIG. 2 is a cross-sectional view taken along a line A-A' of FIG. 1, and FIG. 3 is a cross-sectional view taken along a line B-B' of FIG. 1. FIG. 1 does not show an upper circuit pattern in order to avoid a complex drawing, and FIG. 4 is a plan view of a first bending prevention layer.

Hereinafter, a vertical direction substantially perpendicular to an upper surface of a first substrate may be a first direction, and two directions intersecting each other among horizontal directions substantially parallel to the upper surface of the first substrate may be second and third directions, respectively. In exemplary embodiments of the inventive concept, the second and third directions may be orthogonal to each other.

Referring to FIGS. 1 to 4, the vertical memory device may include a lower circuit pattern on a first substrate 100, a first bending prevention layer 240 over the lower circuit pattern, memory cells on the first bending prevention layer 240, contact plugs 280, 484, 492 and 494, and an upper circuit pattern. The vertical memory device may further include a second substrate 290, a first buffer layer 270, a common source line (CSL) 482, first and second insulating interlayers 160 and 230, a third insulating interlayer pattern 300, and fourth, fifth, sixth, seventh, eighth, ninth, tenth, eleventh and twelfth insulating interlayers 340, 350, 420, 500, 520, 540, 560, 580 and 600.

Each of the first and second substrates 100 and 290 may include semiconductor materials, e.g., silicon, germanium, silicon-germanium, etc., or III-V compounds, e.g., GaP, GaAs, GaSb, etc. In exemplary embodiments of the inventive concept, each of the first and second substrates 100 and 290 may be a silicon-on-insulator (SOI) substrate or a germanium-on-insulator (GOI) substrate.

The first substrate 100 may include a field region on which an isolation pattern 110 is formed, and an active region 105 on which no isolation pattern is formed. The isolation pattern 110 may include an oxide, e.g., silicon oxide.

In exemplary embodiments of the inventive concept, the first substrate 100 may include first, second and third regions I, II and III. The first region I may be a cell array region in which memory cells may be formed, the second region II may be an extension region or pad region in which contact plugs for transferring electrical signals to the memory cells may be formed, and the third region III may be a peripheral circuit region at least partially surrounding the second region II in which an upper circuit pattern for applying electrical signals to the memory cells through the contact plugs may be formed. The first and second regions I and II may form a cell region. The peripheral circuit region may at least partially surround the cell region. FIGS. 1 to 4 show a portion of each of the first to third regions I, II and III.

In exemplary embodiments of the inventive concept, the vertical memory device may have a cell-over-peri (COP) structure. In other words, the lower circuit pattern may be formed on the first substrate 100, and the memory cells, the contact plugs and the upper circuit pattern may be formed over the lower circuit pattern.

The lower circuit pattern may include transistors, lower contact plugs, lower wirings, lower vias, etc. In an exemplary embodiment of the inventive concept, a first transistor including a first lower gate structure 152 on the first substrate 100 and a first impurity region 102 at an upper portion of the active region 105 adjacent the first lower gate structure 152, a second transistor including a second lower gate structure 154 on the first substrate 100 and a second impurity region 104 at an upper portion of the active region 105 adjacent the second lower gate structure 154, and a third impurity region 106 at an upper portion of the active region 105 may be formed.

In the drawings, the third impurity region 106 is formed on the first region I of the first substrate 100, and the first and second transistors are formed on the first and second regions I and II of the first substrate 100, respectively, however, the inventive concept may not be limited thereto.

The first lower gate structure 152 may include a first lower gate insulation pattern 122, a first lower gate electrode 132 and a first lower gate mask 142 sequentially stacked on the first substrate 100, and the second lower gate structure 154 may include a second lower gate insulation pattern 124, a second lower gate electrode 134 and a second lower gate mask 144 sequentially stacked on the first substrate 100.

The first insulating interlayer 160 may be formed on the first substrate 100 to cover the first and second transistors and the third impurity region 106, and first, second and third lower contact plugs 172, 174 and 176 may be formed through the first insulating interlayer 160 to contact the first to third impurity regions 102, 104 and 106, respectively.

First, second and third lower wirings 182, 184 and 186 may be formed on the first insulating interlayer 160 to contact the first to third lower contact plugs 172, 174 and 176, respectively. A first lower via 192, a fourth lower wiring 202, a fourth lower via 212 and a seventh lower wiring 222 may be sequentially stacked on the first lower wiring 182, a second lower via 194, a fifth lower wiring 204, a fifth lower via 214 and an eighth lower wiring 224 may be sequentially stacked on the second lower wiring 184, and a third lower via 196, a sixth lower wiring 206, a sixth lower via 216 and a ninth lower wiring 226 may be sequentially stacked on the third lower wiring 186.

The first to third lower contact plugs 172, 174 and 176, the first to sixth lower vias 192, 194, 196, 212, 214 and 216, and the first to ninth lower wirings 182, 184, 186, 202, 204, 206, 222, 224 and 226 may include a conductive material, e.g., a metal, a metal nitride, a metal silicide, doped polysilicon, etc.

The second insulating interlayer 230 may be formed on the first insulating interlayer 160 to cover the first to ninth lower wirings 182, 184, 186, 202, 204, 206, 222, 224 and 226 and the first to sixth lower vias 192, 194, 196, 212, 214 and 216. The second insulating interlayer 230 and the first insulating interlayer 160 may form a lower insulating interlayer structure, and in some cases, the lower insulating interlayer structure may include a single layer because the first and second insulating interlayers 160 and 230 may be merged with each other.

The first bending prevention layer 240 may be formed on the second insulating interlayer 230. In exemplary embodiments of the inventive concept, the first bending prevention layer 240 may be formed throughout all of the whole regions of the first substrate 100, in other words, throughout the first to third regions I, II and III of the first substrate 100.

In exemplary embodiments of the inventive concept, the first bending prevention layer 240 may include a pattern at an upper portion thereof, which may extend in a direction substantially parallel to the upper surface of the first substrate 100, e.g., in the third direction. In exemplary embodiments of the inventive concept, the pattern may be a first recess 250 on an upper surface of the first bending prevention layer 240. The first recess 250 may have a bar shape extending in the third direction, and a plurality of first recesses 250 may be formed to be spaced apart from each other in the second direction.

The first bending prevention layer 240 may include the pattern extending in the third direction, and thus, a stress may be applied in the third direction to the first substrate 100 over which the first bending prevention layer 240 is formed. Accordingly, when the first substrate 100 is bent downwardly in the third direction, the first bending prevention layer 240 may apply a stress to the first substrate 100 upwardly in the third direction, to decrease the bending of the first substrate 100. In other words, the first bending prevention layer 240 may limit the amount of bending of the first substrate 100 along the third direction.

In exemplary embodiments of the inventive concept, the first bending prevention layer 240 may apply a compressive stress to the first substrate 100, and a portion of the first bending prevention layer 240 having no recess thereon, in other words, a protrusion of the first bending prevention layer 240 may apply a compressive stress higher than that of a portion thereof having the first recess 250 thereon, to reduce a downward bending of the first recess 250.

Alternatively, the first bending prevention layer 240 may apply a tensile stress to the first substrate 100, and a portion of the first bending prevention layer 240 having no recess thereon, in other words, a protrusion of the first bending prevention layer 240 may apply a tensile stress higher than that of a portion thereof having the first recess 250 thereon, to reduce an upward bending of the first substrate 100. In other words, the protrusion of the first bending prevention layer 240 can reduce bending of the first substrate 100 in two opposite directions.

The pattern at the upper portion of the first bending prevention layer 240 may be also referred to as the protrusion instead of the first recess 250.

The pattern at the upper portion of the first bending prevention layer 240 may not extend in the third direction. For example, the pattern may extend in any direction substantially parallel to the upper surface of the first substrate 100. The extension direction of the pattern may depend on the expected bending direction of the first substrate 100.

In exemplary embodiments of the inventive concept, the first bending prevention layer 240 may include a material applying a compressive or tensile stress to neighboring structures. In an exemplary embodiment of the inventive concept, the first bending prevention layer 240 may include a nitride, e.g., silicon nitride. Alternatively, the first bending prevention layer 240 may include a conductive material, e.g., a metal such as tungsten, or doped polysilicon. However, when the first bending prevention layer 240 includes the conductive material, it may be spaced apart from other conductive structures to be electrically insulated therefrom, or an insulating material covering the conductive material may be further formed.

The first buffer layer 270 may be formed on the first bending prevention layer 240 to cover the pattern, and may have a flat upper surface. Thus, when the first recess 250 is formed on the first bending prevention layer 240, the first buffer layer 270 may be formed on the first bending prevention layer 240 to fill the first recess 250. The first buffer layer 270 may include an oxide, e.g., silicon oxide.

The second substrate 290 may be formed on the first bending prevention layer 240 and the first buffer layer 270. In exemplary embodiments of the inventive concept, the second substrate 290 may be formed on the first and second regions I and II of the first substrate 100, and a sidewall of the second substrate 290 may be covered by the third insulating interlayer pattern 300 on the second insulating interlayer 230. The third insulating interlayer pattern 300 may include an oxide, e.g., silicon oxide, and may be merged with the second insulating interlayer 230.

The first contact plug 280 may extend through the first buffer layer 270, the first bending prevention layer 240 and the second insulating interlayer 230 to contact a lower surface of the second substrate 290 and an upper surface of the ninth lower wiring 226, and thus, electrical signals may be transferred therebetween. In exemplary embodiments of the inventive concept, the first contact plug 280 may extend through and contact the first bending prevention layer 240. However, when the first bending prevention layer 240 includes a conductive material, an insulation spacer may be further formed to cover a sidewall of the first contact plug 280. Alternatively, as will be illustrated later with reference to FIGS. 21, 22A and 22B, the first contact plug 280 may extend through the first bending prevention layer 240 but be spaced apart from a sidewall of the first bending prevention layer 240.

In the drawings, the first contact plug 280 extends through the first recess 250 of the first bending prevention layer 240; however, the inventive concept may not be limited thereto. For example, the first contact plug 280 may extend through a portion of the first bending prevention layer 240 on which the first recess 250 is not formed. Additionally, in the drawings, the first contact plug 280 is formed on the first region I of the first substrate 100, however, the inventive concept may not be limited thereto, and the first contact plug 280 may be formed on the second region II of the first substrate 100.

The memory cells may be formed on the second substrate 290 on the first and second regions I and II of the first substrate 100.

The memory cells may be arranged in each of the second and third directions to form a memory cell array. The memory cell array may include a plurality of memory cell blocks spaced apart from each other in the third direction, which may be divided by the CSL 482 extending in the second direction.

Each memory cell block may include a channel block therein. Each channel block may include a plurality of channel columns containing a plurality of channels 380 arranged in the second direction. In the drawings, each channel block includes nine channel columns sequentially arranged in the third direction; however, the inventive concept may not be limited thereto.

Each memory cell block may include a plurality of gate electrodes 462, 464 and 466 spaced apart from each other in the first direction, insulation patterns 315 between neighboring ones of the gate electrodes 462, 464 and 466, pillar structures extending through the gate electrodes 462, 464 and 466 and insulation patterns 315, and a capping pattern 400.

The gate electrodes 462, 464 and 466 may be formed on the first and second regions I and II of the first substrate 100, and the gate electrodes 462, 464 and 466 may be formed at a plurality of levels, respectively, to be spaced apart from each other. Each of the gate electrodes 462, 464 and 466 may extend in the second direction on the first and second regions I and II of the first substrate 100. Extension lengths of the gate electrodes 462, 464 and 466 in the second direction may gradually decrease from a lowermost level toward an uppermost level, and thus, the gate electrodes 462, 464 and 466 may form a staircase shape.

The gate electrodes 462, 464 and 466 may include first, second and third gate electrodes 462, 464 and 466 sequentially stacked in the first direction. The first gate electrode 462 may be a ground selection line (GSL), the second gate electrode 464 may be a word line, and the third gate electrode 466 may be a string selection line (SSL).

Each of the first to third gate electrodes 462, 464 and 466 may be formed at one or a plurality of levels. In exemplary embodiments of the inventive concept, the first gate electrode 462 may be formed at the lowermost level, the third gate electrode 466 may be formed at the uppermost level and a level directly below the uppermost level, e.g., a second level from above, and the second gate electrode 464 may be formed at a plurality of levels between the first and third gate electrodes 462 and 466.

In exemplary embodiments of the inventive concept, an end portion in the second direction of at least one of the gate electrodes 462, 464 and 466 at the respective levels may have a thickness greater than that of other portions thereof. The thick end portion of at least one of the gate electrodes 462, 464 and 466 may be referred to as a conductive pad. In the drawings, the first gate electrode 462 and an uppermost one of the third gate electrodes 466 have no conductive pad, however, the inventive concept may not be limited thereto.

Each of the gate electrodes 462, 464 and 466 may include a conductive pattern and a barrier pattern covering upper and lower surfaces and a sidewall of the conductive pattern. The conductive pattern may include a low resistance metal, e.g., tungsten, titanium, tantalum, platinum, etc., and the barrier pattern may include a metal nitride, e.g., titanium nitride, tantalum nitride, etc.

Sidewalls of the gate electrodes 462, 464 and 466, which may be stacked in a staircase shape, may be covered by the fourth insulating interlayer 340 on the third insulating interlayer pattern 300, and the fifth to twelfth insulating interlayers 350, 420, 500, 520, 540, 560, 580 and 600 may be sequentially stacked on an uppermost one of the insulation patterns 315 and the fourth insulating interlayer 340. The fourth to twelfth insulating interlayers 340, 350, 420, 500, 520, 540, 560, 580 and 600 may include an oxide, e.g., silicon oxide, and thus, may be merged with each other and/or merged with the third insulating interlayer pattern 300.

An upper surface, a lower surface, and a sidewall adjacent the channel 380 or the semiconductor pattern 360 of each of the gate electrodes 462, 464 and 466 may be covered by a second blocking layer 450. The second blocking layer 450 may include a metal oxide, e.g., aluminum oxide, hafnium oxide, etc., and may also cover a sidewall of each of the insulation patterns 315.

The insulation patterns 315 may include an oxide, e.g., silicon oxide.

Each of the pillar structures may include the semiconductor pattern 360, a charge storage structure 370, the channel 380 and a filling pattern 390 on the second substrate 290, and the capping pattern 400 may be formed on each of the pillar structures.

The semiconductor pattern 360 may include single crystalline silicon or single crystalline germanium depending on the material of the second substrate 290, and in some embodiments of the inventive concept, may be doped with impurities. In exemplary embodiments of the inventive concept, the semiconductor pattern 360 may have a pillar shape, and an upper surface of the semiconductor pattern 360 may be located between upper and lower surfaces of one of the insulation patterns 315 at a second level from below in the first direction. The semiconductor pattern 360 may be a channel like the overlying channel 380, and thus, may be referred to as a lower channel.

The channel 380 may extend in the first direction on a central upper surface of the semiconductor pattern 360 to have a cup-like shape. The charge storage structure 370 may extend in the first direction on an edge upper surface of the semiconductor pattern 360 to cover an outer sidewall of the channel 380, and may have a cup-like shape of which a central lower surface is opened. The filling pattern 390 may have a pillar shape for filling an inner space defined by the cup-like shape channel 380.

The charge storage structure 370 may include a first blocking pattern, a charge storage pattern and a tunnel insulation pattern sequentially stacked in the horizontal direction from an outer sidewall of the channel 380.

The channel 380 may include doped or undoped single crystalline silicon. The first blocking pattern of the charge storage structure 370 may include an oxide, e.g., silicon oxide, the charge storage pattern of the charge storage structure 370 may include a nitride, e.g., silicon nitride, and the tunnel insulation pattern of the charge storage structure 370 may include an oxide, e.g., silicon oxide. The filling pattern 390 may include an oxide, e.g., silicon oxide.

The capping pattern 400 may include doped or undoped single crystalline silicon or polysilicon. The capping pattern 400 may extend through the fifth insulating interlayer 350 and an upper portion of the uppermost one of the insulation patterns 315.

The CSL 482 may extend in the first direction on the second substrate 290, and may contact an upper surface of a fourth impurity region 292 at an upper portion of the second substrate 290. The CSL 482 may extend in the second direction to separate the gate electrodes 462, 464 and 466 from each other in the third direction. However, both sidewalls of the CSL 482 may be covered by a third spacer 472 including an insulating material, to be electrically insulated from the gate electrodes 462, 464 and 466.

The second contact plug 484 may extend in the first direction on the second region II of the first substrate 100 to be connected to the seventh lower wiring 222, and may extend through the fifth and sixth insulating interlayers 350 and 420, the insulation patterns 315, the gate electrodes 462, 464 and 466, the second substrate 290, the first buffer layer 270, the first bending prevention layer 240 and the second insulating interlayer 230. A second spacer 474 including an insulating material, e.g., silicon oxide, may be formed on a sidewall of the second contact plug 484, and the second contact plug 484 and the second spacer 474 may form a second contact plug structure.

In exemplary embodiments of the inventive concept, the second contact plug structure may extend through and contact the first bending prevention layer 240. However, the second contact plug 484 of which a sidewall may be covered by the second spacer 474 may not be electrically shorted with the first bending prevention layer 240 even though the first bending prevention layer 240 includes a conductive material.

In the drawings, the second contact plug structure extends through the first recess 250 of the first bending prevention layer 240; however, the inventive concept may not be limited thereto. For example, the second contact plug structure may extend through another portion of the first bending prevention layer 240. Additionally, the second contact plug structure may be formed not only on the second region II of the first substrate 100 but also on a portion of the first region I of the first substrate 100 adjacent thereto.

The third contact plug 492 may extend through the fourth to sixth insulating interlayers 340, 350 and 420, the insulation patterns 315 and the second blocking layer 450 to contact one of the first to third gate electrodes 462, 464 and 466 on the second region II of the first substrate 100. In addition, the fourth contact plug 494 may extend through the second, fourth, fifth and sixth insulating interlayers 230, 340, 350 and 420, the third insulating interlayer pattern 300, the first buffer layer 270 and the first bending prevention layer 240 to contact the eighth lower wiring 224 on the third region III of the first substrate 100.

The third contact plug 492 may contact the conductive pad of a corresponding one of the first to third gate electrodes 462, 464 and 466.

In exemplary embodiments of the inventive concept, the fourth contact plug 494 may contact the first bending prevention layer 240. However, when the first bending prevention layer 240 includes a conductive material, the first contact plug 280 may extend through but may not contact the first bending prevention layer 240. In this case, an additional insulation spacer may be further formed on a sidewall of the fourth contact plug 494, or the fourth contact plug 494 may be spaced apart from a sidewall of the first bending prevention layer 240 as will be illustrated with reference to FIGS. 21, 22A and 22B.

In the drawings, the fourth contact plug 494 extends through the first recess 250 of the first bending prevention layer 240; however, the inventive concept may not be limited thereto. For example, the fourth contact plug 494 may extend through another portion of the first bending prevention layer 240.

The upper circuit pattern may include, e.g., upper contact plugs, upper wirings, upper vias, etc.

First, second, third and fourth upper contact plugs 512, 514, 516 and 517 may extend through the seventh insulating interlayer 500 on the sixth insulating interlayer 420, the CSL 482, and the second to fourth contact plugs 484, 492 and 494 to contact upper surfaces of the third and fourth contact plugs 492 and 494, the CSL 482, and the second contact plug 484, respectively. In addition, the fifth upper contact plug 518 may extend through the sixth and seventh insulating interlayers 420 and 500 to contact an upper surface of the capping pattern 400.

First, second, third, fourth and fifth upper wirings 532, 534, 536, 537 and 538 may extend through the eighth insulating interlayer 520 on the seventh insulating interlayer 500 and the first to fifth upper contact plugs 512, 514, 516, 517 and 518 to contact upper surfaces of the first to fifth upper contact plugs 512, 514, 516, 517 and 518, respectively.

First, second, third, fourth and fifth upper vias 552, 554, 556, 557 and 558 may extend through the ninth insulating interlayer 540 on the eighth insulating interlayer 520 and the first to fifth upper wirings 532, 534, 536, 537 and 538 to contact upper surfaces of the first to fifth upper wirings 532, 534, 536, 537 and 538, respectively.

Sixth, seventh, eighth, ninth and tenth upper wirings 572, 574, 576, 577 and 578 may extend through the tenth insulating interlayer 560 on the ninth insulating interlayer 540 and the first to fifth upper vias 552, 554, 556, 557 and 558 to contact upper surfaces of the first to fifth upper vias 552, 554, 556, 557 and 558, respectively.

Sixth, seventh and eighth upper vias 594, 596 and 597 may extend through the eleventh insulating interlayer 580 on the tenth insulating interlayer 560 and the sixth to tenth upper wirings 572, 574, 576, 577 and 578 to contact upper surfaces of the seventh to ninth upper wirings 574, 576 and 577, respectively.

Eleventh, twelfth and thirteenth upper wirings 614, 616 and 617 may extend through the twelfth insulating interlayer 600 on the eleventh insulating interlayer 580 and the sixth to eighth upper vias 594, 596 and 597 to contact upper surfaces of the sixth to eighth upper vias 594, 596 and 597, respectively.

In exemplary embodiments of the inventive concept, the tenth upper wiring 578 may extend in the third direction, and a plurality of tenth upper wirings 578 may be spaced apart from each other in the second direction. The tenth upper wiring 578 may be a bit line of the vertical memory device.

The vertical memory device may include the first bending prevention layer 240 between the lower insulating interlayer structure covering the lower circuit pattern and the second substrate 290, and the pattern may be formed at the upper portion of the first bending prevention layer 240 to extend in the horizontal direction so that the bending of the first substrate 100, e.g., in a particular direction, may be reduced or prevented.

FIGS. 5 to 18 are plan views and cross-sectional views illustrating a method of manufacturing a vertical memory device in accordance with exemplary embodiments of the inventive concept. For example, FIGS. 5, 11, 13 and 16 are the plan views, and FIGS. 6-10, 12, 14-15 and 17-18 are the cross-sectional views.

Figure 14:
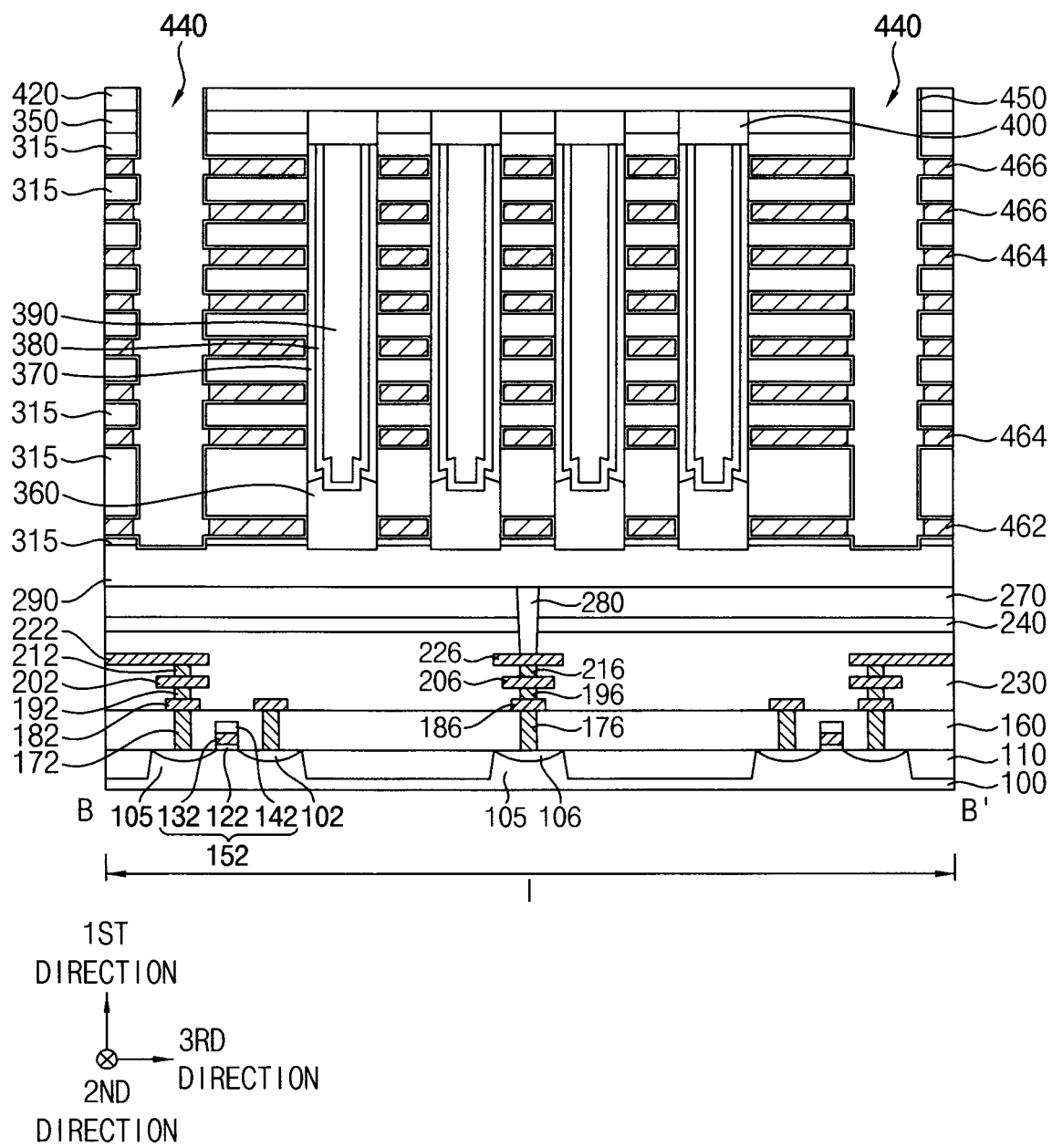
Figure 17:
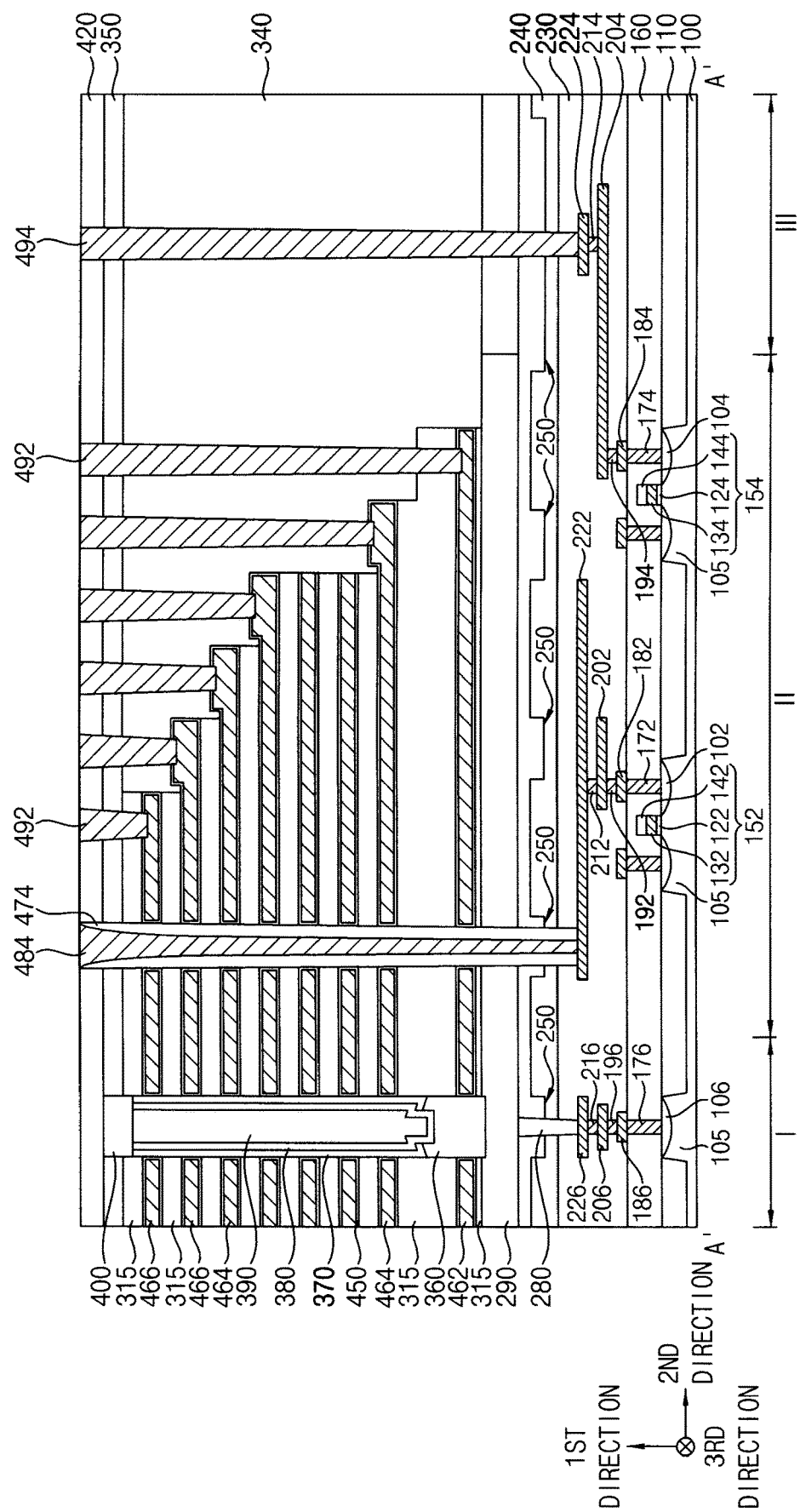
Figure 18:
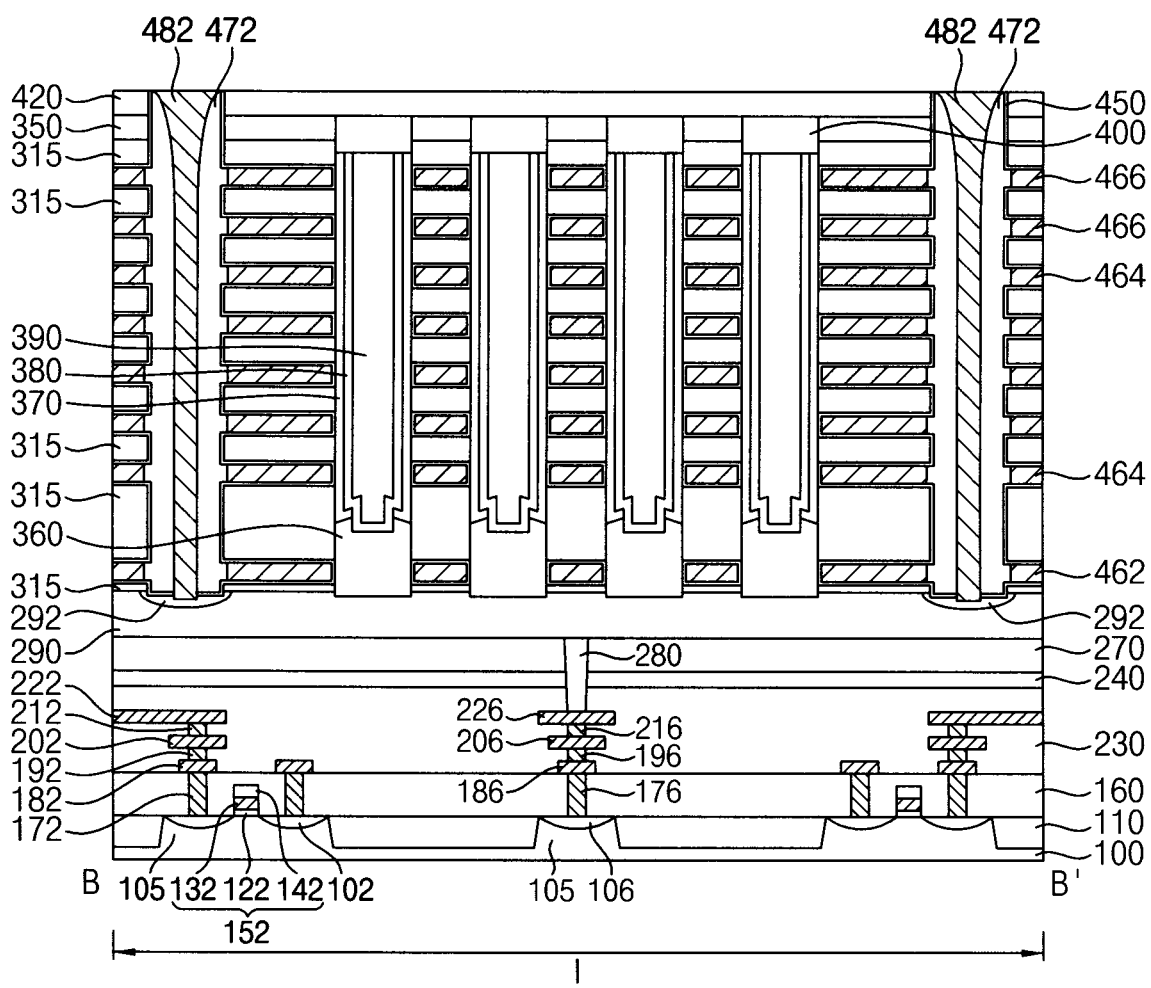
Figure 18:
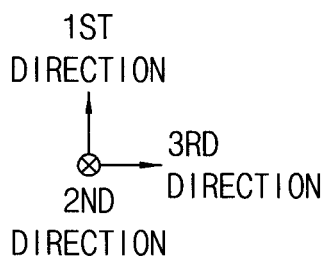

FIGS. 6-10, 12, 15 and 17 are cross-sectional views taken along lines A-A' of corresponding plan views, respectively, and FIGS. 14 and 18 are cross-sectional views taken along lines B-B' of corresponding plan views, respectively.

Figure 5:
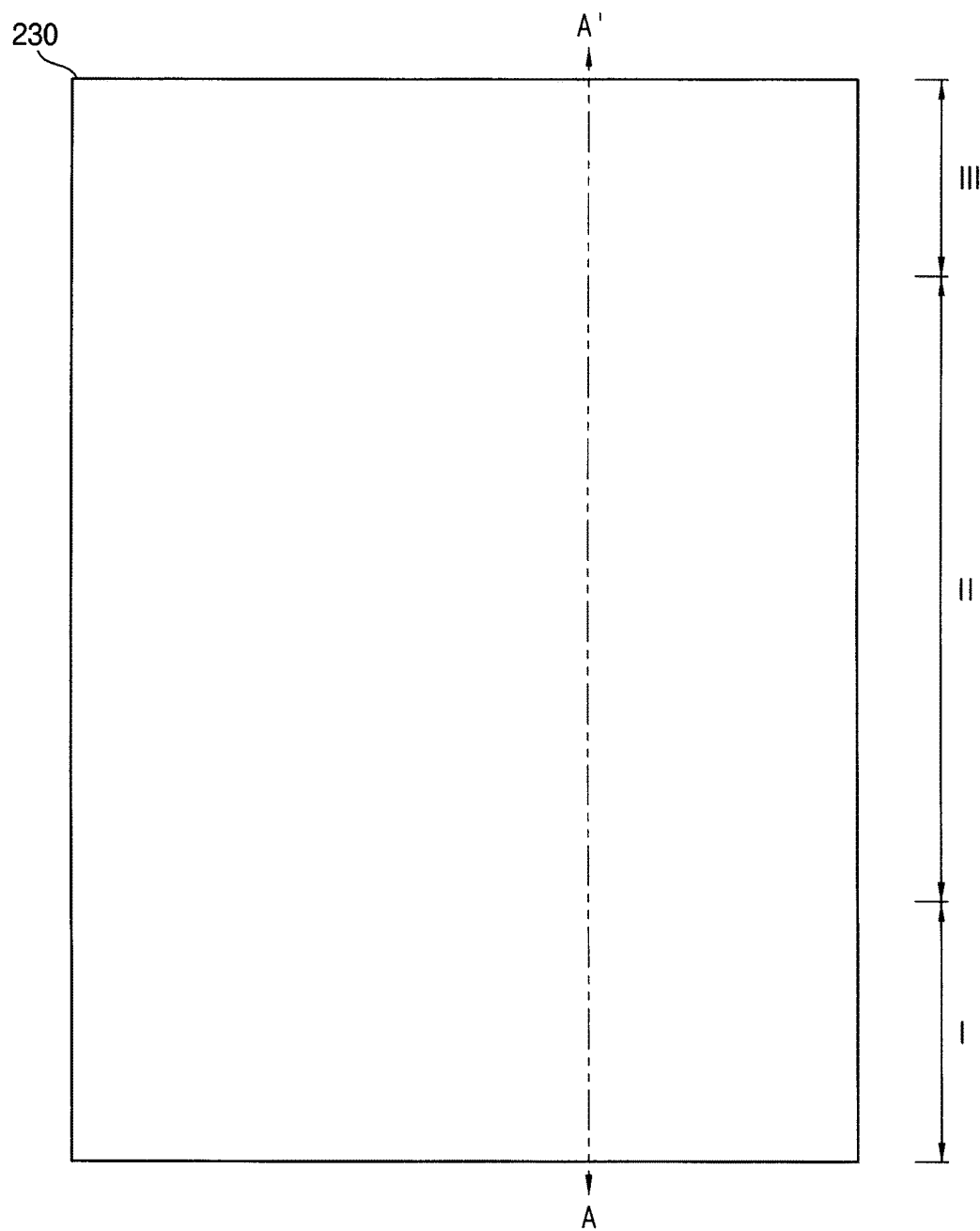
FIGS. 5, 6, 7, 8, 9, 10, 11, 12, 13, 14, 15, 16, 17 and 18 are plan views and cross-sectional views illustrating a method of manufacturing a vertical memory device in accordance with exemplary embodiments of the inventive concept.
Figure 6:
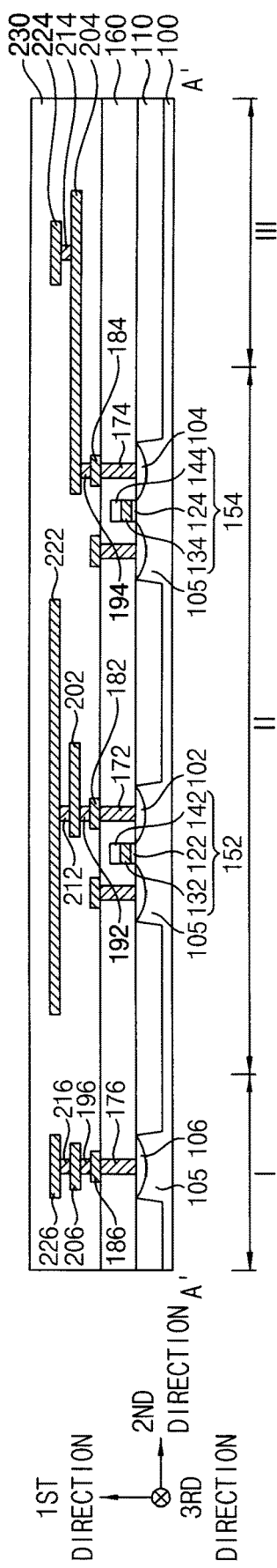

Referring to FIGS. 5 and 6, a lower circuit pattern may be formed on a first substrate 100, and first and second insulating interlayers 160 and 230 may be sequentially formed on the first substrate 100 to cover the lower circuit pattern.

An isolation pattern 10 may be formed on the first substrate 100 by, e.g., a shallow trench isolation (STI) process. First, second and third impurity regions 102, 104 and 106 may be formed by, e.g., an ion implantation process. First and second lower gate structures 152 and 154, first, second and third lower contact plugs 172, 174 and 176, first, second, third, fourth, fifth and sixth lower vias 192, 194, 196, 212, 214 and 216, and first, second, third, fourth, fifth, sixth, seventh, eighth and ninth lower wirings 182, 184, 186, 202, 204, 206, 222, 224 and 226, which may form the lower circuit pattern, may be formed by a patterning process or a damascene process.

The first insulating interlayer 160 may be formed on the first substrate 100 to cover the first to third impurity regions 102, 104 and 106 and the first and second lower gate structures 152 and 154, and surround sidewalls of the first to third lower contact plugs 172, 174 and 176. The second insulating interlayer 230 may be formed on the first insulating interlayer 160 to cover the first to ninth lower wirings 182, 184, 186, 202, 204, 206, 222, 224 and 226 and the first to sixth lower vias 192, 194, 196, 212, 214 and 216.

Figure 7:
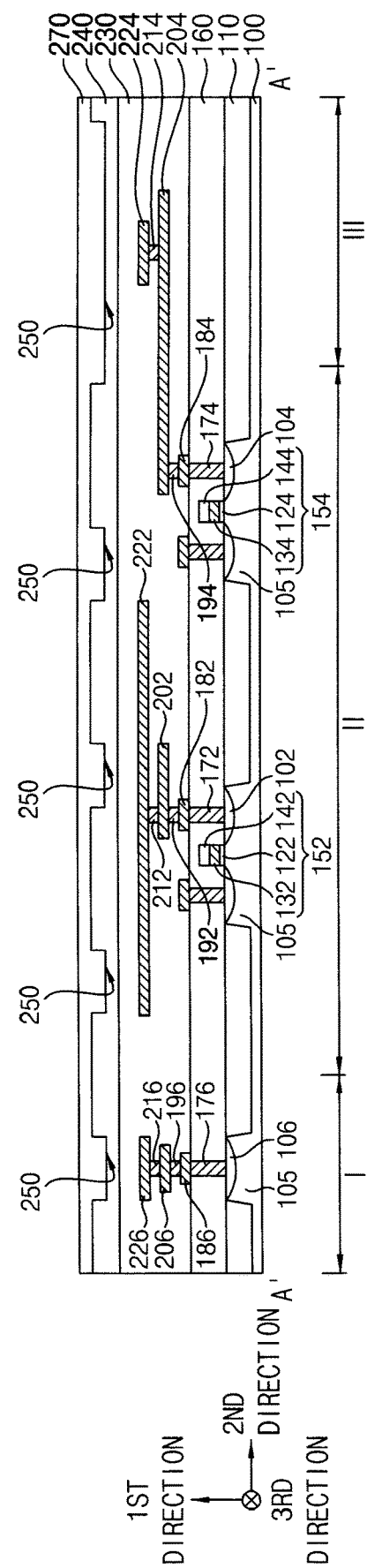

Referring to FIG. 7, a first bending prevention layer 240 and a first buffer layer 270 may be formed on the second insulating interlayer 230.

In exemplary embodiments of the inventive concept, the first bending prevention layer 240 may include a pattern extending in the third direction at an upper portion thereof. In exemplary embodiments of the inventive concept, the pattern may be a first recess 250 on an upper surface of the first bending prevention layer 240. The first recess 250 may have a bar shape extending in the third direction, and a plurality of first recesses 250 may be formed to be spaced apart from each other in the second direction. The first recess 250 may be formed by forming the first bending prevention layer 240 and partially etching an upper portion of the first bending prevention layer 240 using a first etching mask.

Alternatively, the pattern may be formed by forming a protrusion on the first bending prevention layer 240 through a deposition process.

When the first bending prevention layer 240 includes a conductive material, the first bending prevention layer 240 may be formed not to directly contact other conductive structures through which the first bending prevention layer 240 extends. If the first bending prevention layer 240 contacts other conductive structures, an insulating structure may be further formed to cover a sidewall of the conductive material of the first bending prevention layer 240.

The first buffer layer 270 may be formed on the first bending prevention layer 240 to cover the pattern, and may have a flat upper surface. Thus, when the first recess 250 is formed on the first bending prevention layer 240, the first buffer layer 270 may be formed on the first bending prevention layer 240 to fill the first recess 250.

A first contact plug 280 may be formed through the first buffer layer 270, the first bending prevention layer 240 and the second insulating interlayer 230 to contact an upper surface of the ninth lower wiring 226 on the first region I of the first substrate 100. In exemplary embodiments of the inventive concept, the first contact plug 280 may contact the first bending prevention layer 240. However, when the first bending prevention layer 240 includes a conductive material, the first contact plug 280 may extend through but may not contact the first bending prevention layer 240. In this case, an additional insulation spacer may be formed to cover a sidewall of the first contact plug 280, or the first contact plug 280 may be formed to be spaced apart from a sidewall of the first bending prevention layer 240, which will be illustrated later. In other words, there may be a gap in the recess 250 to permit the first contact plug 280 to pass through the first bending prevention layer 240 without contacting the first bending prevention layer 240.

In the drawings, the first contact plug 280 extends through the first recess 250 of the first bending prevention layer 240; however, the inventive concept may not be limited thereto.

Figure 8:
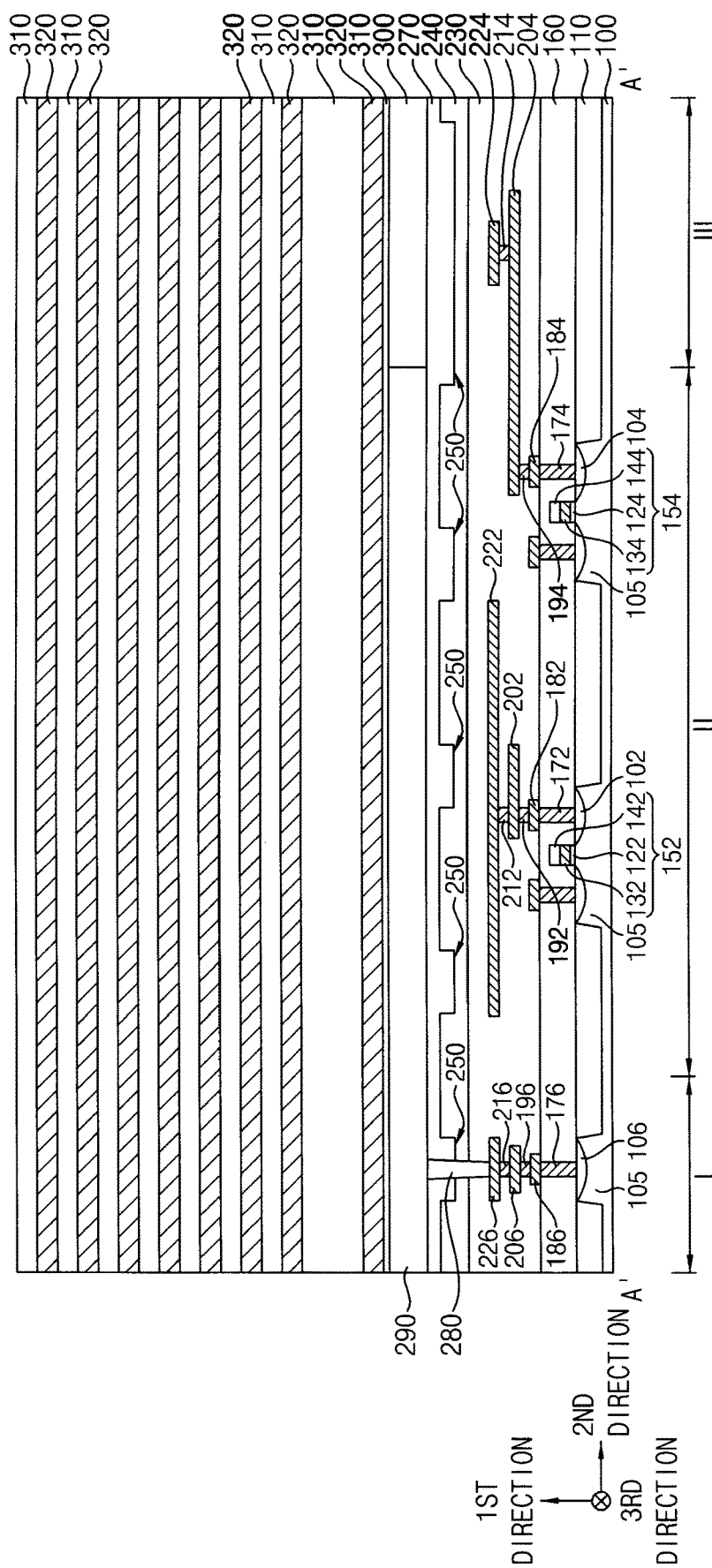

Referring to FIG. 8, a second substrate 290 may be formed on the first buffer layer 270 and the first contact plug 280, and a third insulating interlayer pattern 300 may be formed on the second insulating interlayer 230 to cover a sidewall of the second substrate 290.

The second substrate 290 may be formed on the second insulating interlayer 230, and then, may be patterned to remain only on the first and second regions I and II of the first substrate 100.

The third insulating interlayer pattern 300 may be formed on the second insulating interlayer 230 to cover the second substrate 290, and may be planarized until an upper surface of the second substrate 290 may be exposed.

An insulation layer 310 and a sacrificial layer 320 may be alternately and repeatedly stacked on the second substrate 290 and the third insulating interlayer pattern 300. Accordingly, a plurality of insulation layers 310 and a plurality of sacrificial layers 320 may be alternately stacked in the first direction.

The insulation layer 310 may include an oxide, e.g., silicon oxide, and the sacrificial layer 320 may include a material having an etching selectivity with respect to the insulation layer 310, e.g., a nitride such as silicon nitride.

Figure 9:
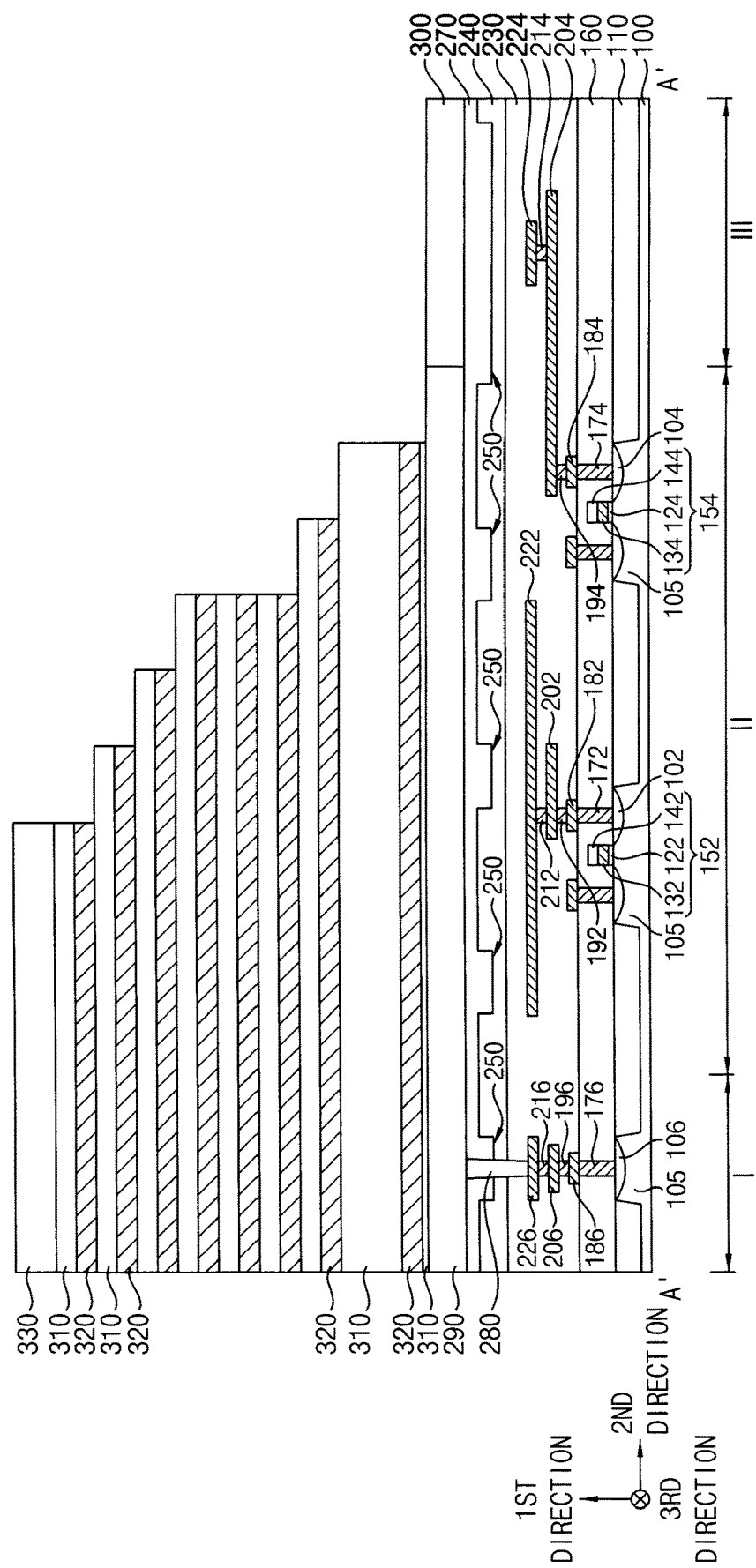

Referring to FIG. 9, an etch stop layer 330 may be formed on an uppermost one of the insulation layers 310, a photoresist pattern partially covering the etch stop layer 330 may be formed thereon, and the etch stop layer 330, the uppermost one of the insulation layers 310, and an uppermost one of the sacrificial layers 320 thereunder may be etched using the photoresist pattern as an etching mask. Accordingly, a portion of one of the insulation layers 310 directly under the uppermost one of the sacrificial layers 320 may be exposed.

After a trimming process for reducing an area of the photoresist pattern by a given ratio is performed, an etching process may be performed such that the etch stop layer 330, the uppermost one of the insulation layers 310, the uppermost one of the sacrificial layers 320, the exposed one of the insulation layers 310 and one of the sacrificial layers 320 thereunder may be etched using the reduced photoresist pattern as an etching mask. As the trimming process and the etching process are repeatedly performed, a mold including a plurality of step layers which may include the sacrificial layer 320 and the insulation layer 310 sequentially stacked and having a staircase shape may be formed.

Hereinafter, each of the "step layers" may include not only an exposed portion, but also a portion thereof covered by upper level step layers, and thus, may refer to an entire portion of the sacrificial layer 320 and an entire portion of the insulation layer 310 at the same level. The exposed portion of the step layer not covered by upper step layers may be referred to as a "step." In exemplary embodiments of the inventive concept, the steps may be arranged in the second direction, and may be also arranged in the third direction.

The mold may be formed on the second substrate 290 on the first and second regions I and II of the first substrate 100. In this case, the steps in the mold may be formed in the second region II of the first substrate 100.

Figure 10:
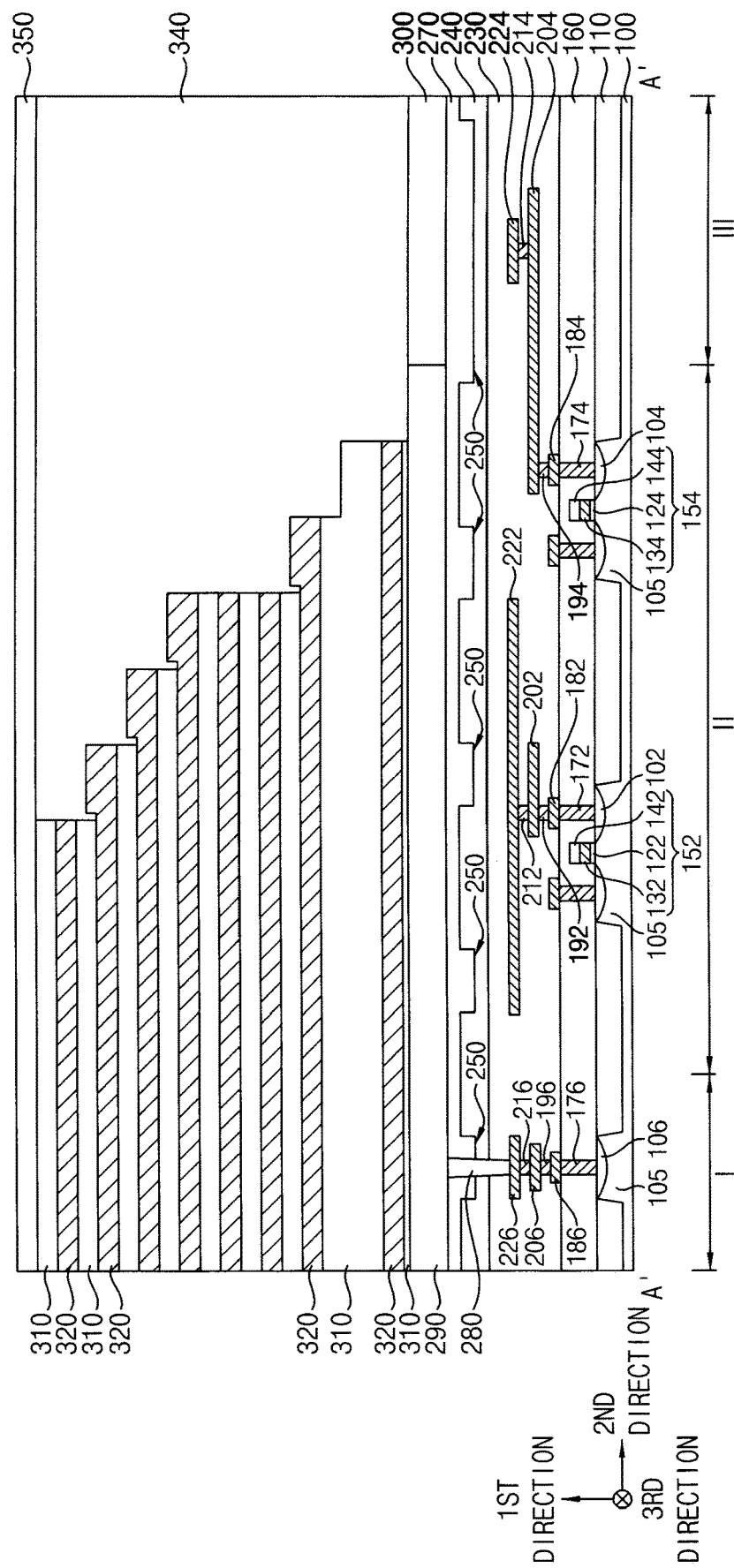

Referring to FIG. 10, a thickness of an end portion in the second direction of at least one of the sacrificial layers 320 may be increased to form an insulation pad.

In an exemplary embodiment of the inventive concept, the insulation pad may be formed by removing an end portion in the second direction of the insulation layer 310 included in each of the steps to expose an end portion in the second direction of the sacrificial layer 320 in each of the steps, forming a pad layer on the etch stop layer 330, the mold, the second substrate 290 and the third insulation pattern 300, and removing a portion of the pad layer on a sidewall of the mold. A portion of the pad layer on upper surfaces of the etch stop layer 330, a lowermost one of the insulation layers 310, the second substrate 290 and the third insulating interlayer pattern 300 may also be removed.

The pad layer may include a material substantially the same as that of the sacrificial layer 320, and thus, may be merged to the sacrificial layer 320 to form the insulation pad. An end portion in the second direction of each of the sacrificial layers 320 where the insulation pad is formed may have a thickness greater than that of other portions thereof.

A fourth insulating interlayer 340 may be formed on the third insulating interlayer pattern 300 to cover the mold and the etch stop layer 330, and may be planarized until an upper surface of the uppermost one of the insulation layers 310 may be exposed. Thus, the etch stop layer 330 may be removed, and a sidewall of the mold may be covered by the fourth insulating interlayer 340.

A fifth insulating interlayer 350 may be formed on an upper surface of the mold and an upper surface of the fourth insulating interlayer 340.

Figure 11:
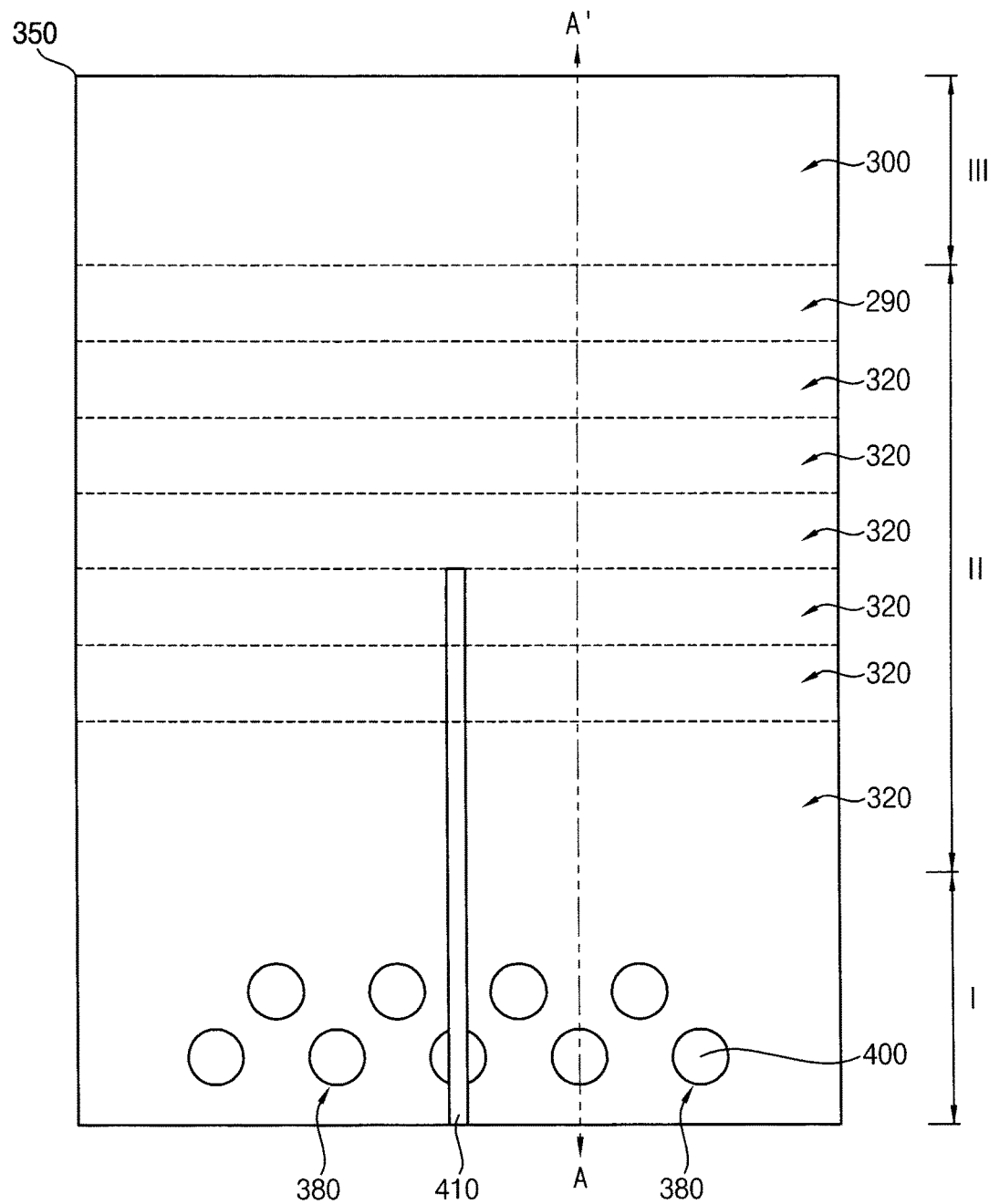
Figure 11:
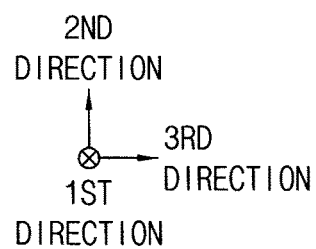
Figure 12:
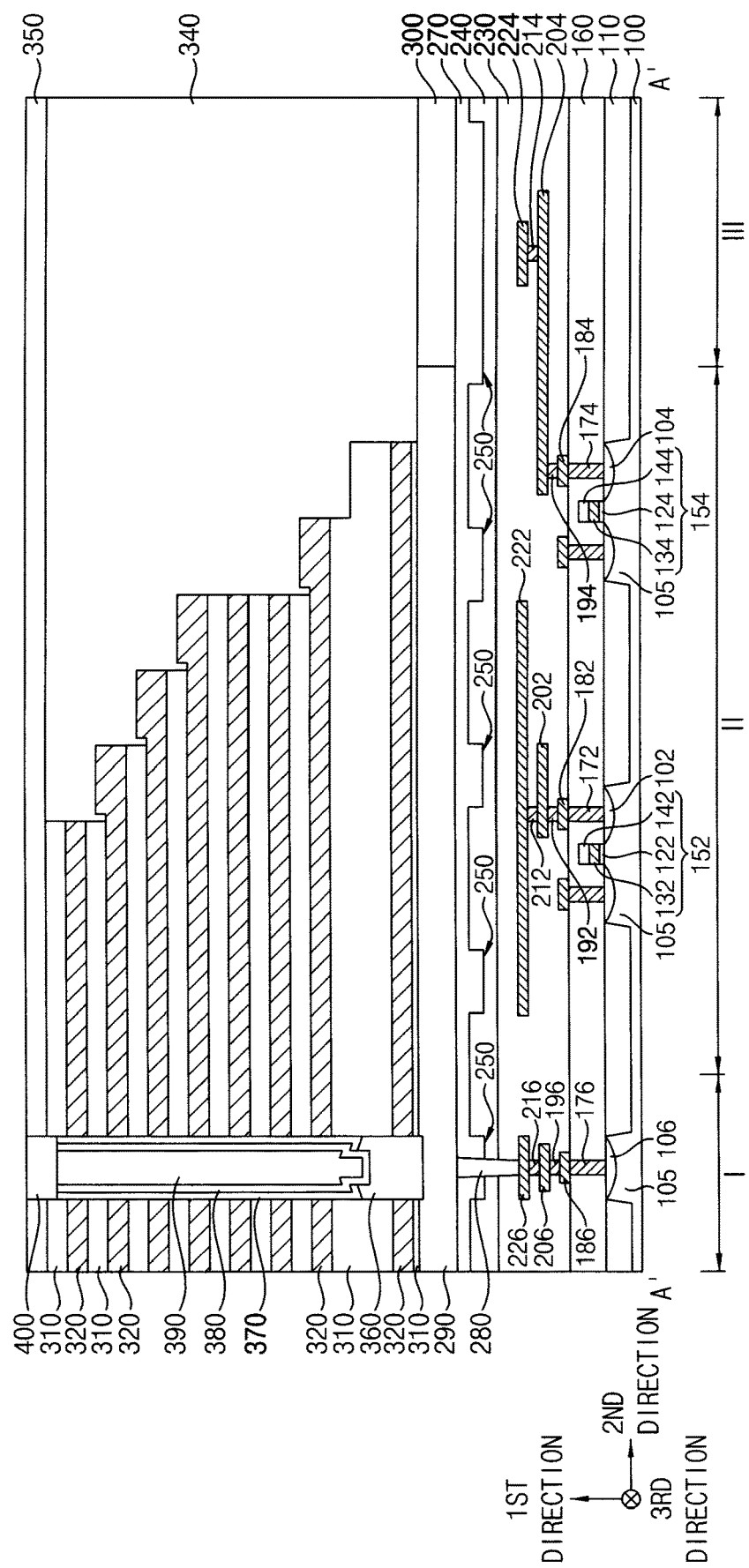

Referring to FIGS. 11 and 12, after forming a second etching mask on the fifth insulating interlayer 350, the fifth insulating interlayer 350, the insulation layers 310 and the sacrificial layers 320 thereunder may be etched using the second mask as an etching mask to form a channel hole therethrough to expose an upper surface of the second substrate 290.

After removing the second etching mask, a semiconductor pattern 360 partially filling the channel hole may be formed. A plurality of channel holes may be formed at this time. The semiconductor pattern 360 may be formed by a selective epitaxial growth (SEG) process using the upper surface of the second substrate 290 exposed by the channel hole as a seed to fill a lower portion of the channel hole.

A charge storage structure layer and a first spacer layer may be sequentially formed on sidewalls of the channel holes, an upper surface of the semiconductor pattern 360 and an upper surface of the fifth insulating interlayer 350, the first spacer layer may be anisotropically etched to form a first spacer only on the sidewalls of the channel holes, and the charge storage structure layer may be etched using the first spacer as an etching mask to form a charge storage structure 370 on each of the sidewalls of the channel holes, the charge storage structure 370 having a cup-like shape of which a central lower surface is opened on the semiconductor pattern. During the etching process, an upper portion of the semiconductor pattern 360 may be also partially removed.

After removing the first spacer, a channel layer may be formed on the exposed semiconductor pattern 360, the charge storage structure 370 and the fifth insulating interlayer 350, and a filling layer may be formed on the channel layer to fill remaining portions of the channel holes. The filling layer and the channel layer may be planarized until an upper surface of the fifth insulating interlayer 350 may be exposed to form a filling pattern 390 to fill the remaining portion of each of the channel holes, and the channel layer may be transformed into a channel 380.

An upper portion of a pillar structure including the semiconductor pattern 360, the charge storage structure 370, the channel 380 and the filling pattern 390 sequentially stacked may be removed to form a trench, and a capping pattern 400 may be formed to fill the trench.

A third etching mask may be formed on the fifth insulating interlayer 350, a first opening may be formed through the fifth insulating interlayer 350, and some of the insulation layers 310 and the sacrificial layers 320, and a division pattern 410 may be formed to fill the first opening.

In an exemplary embodiment of the inventive concept, the division pattern 410 may extend through upper portions of some of the channels 380. Additionally, the division pattern 410 may extend through the fifth insulating interlayer 350, individual ones of the sacrificial layers 320 at upper two levels, respectively, and individual ones of the insulation layers 310 at upper two levels, respectively, and partially through one of the insulation layers 310 at a third level from above. The division pattern 410 may extend in the second direction on the first and second regions I and II of the first substrate 100, and may extend through two upper step layers in the mold. Accordingly, the individual sacrificial layers 320 at the two upper levels may be divided in the third direction by the division pattern 410.

Figure 13:
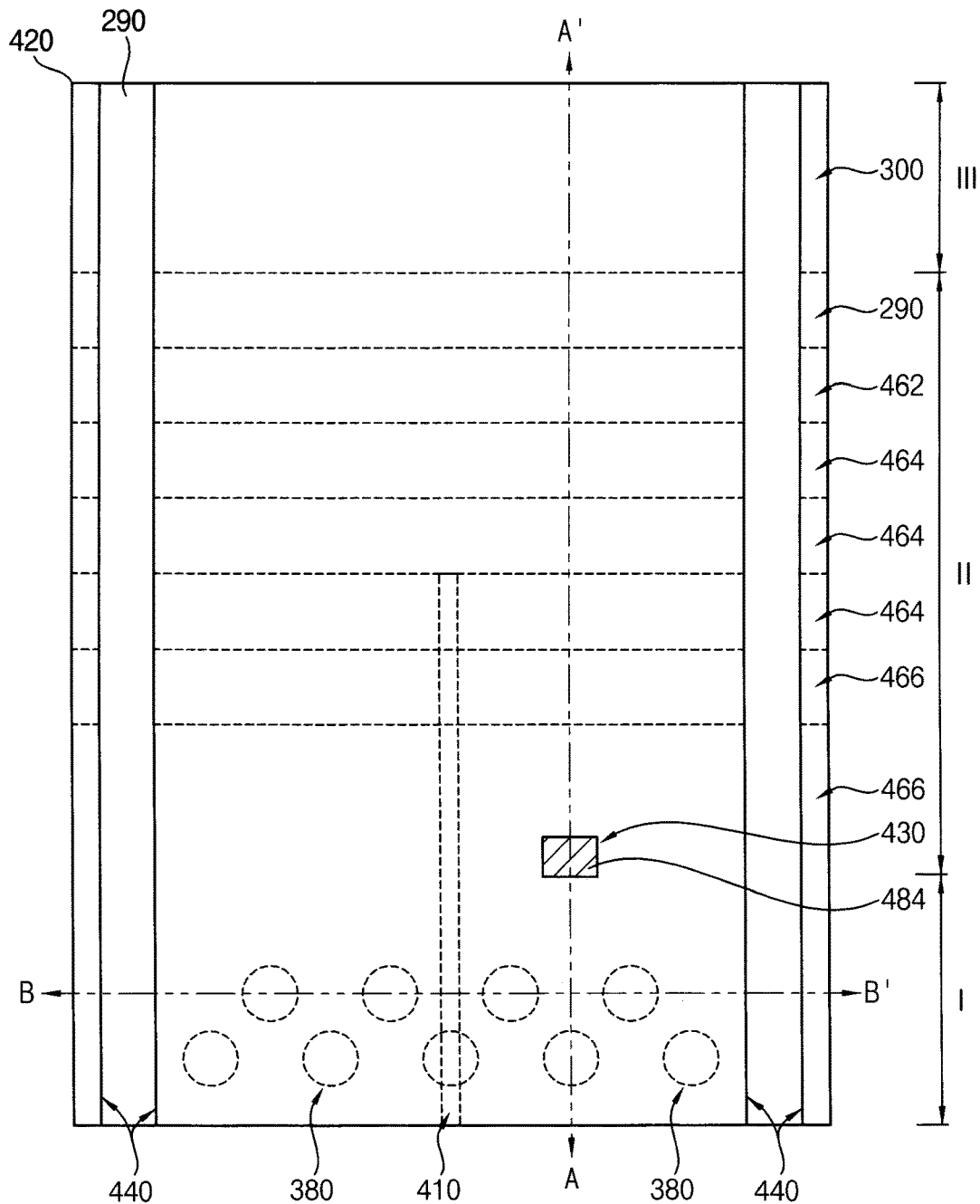
Figure 13:
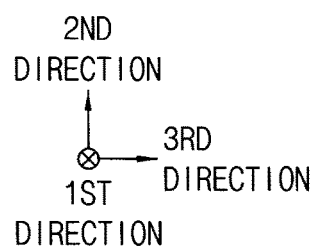
Figure 15:
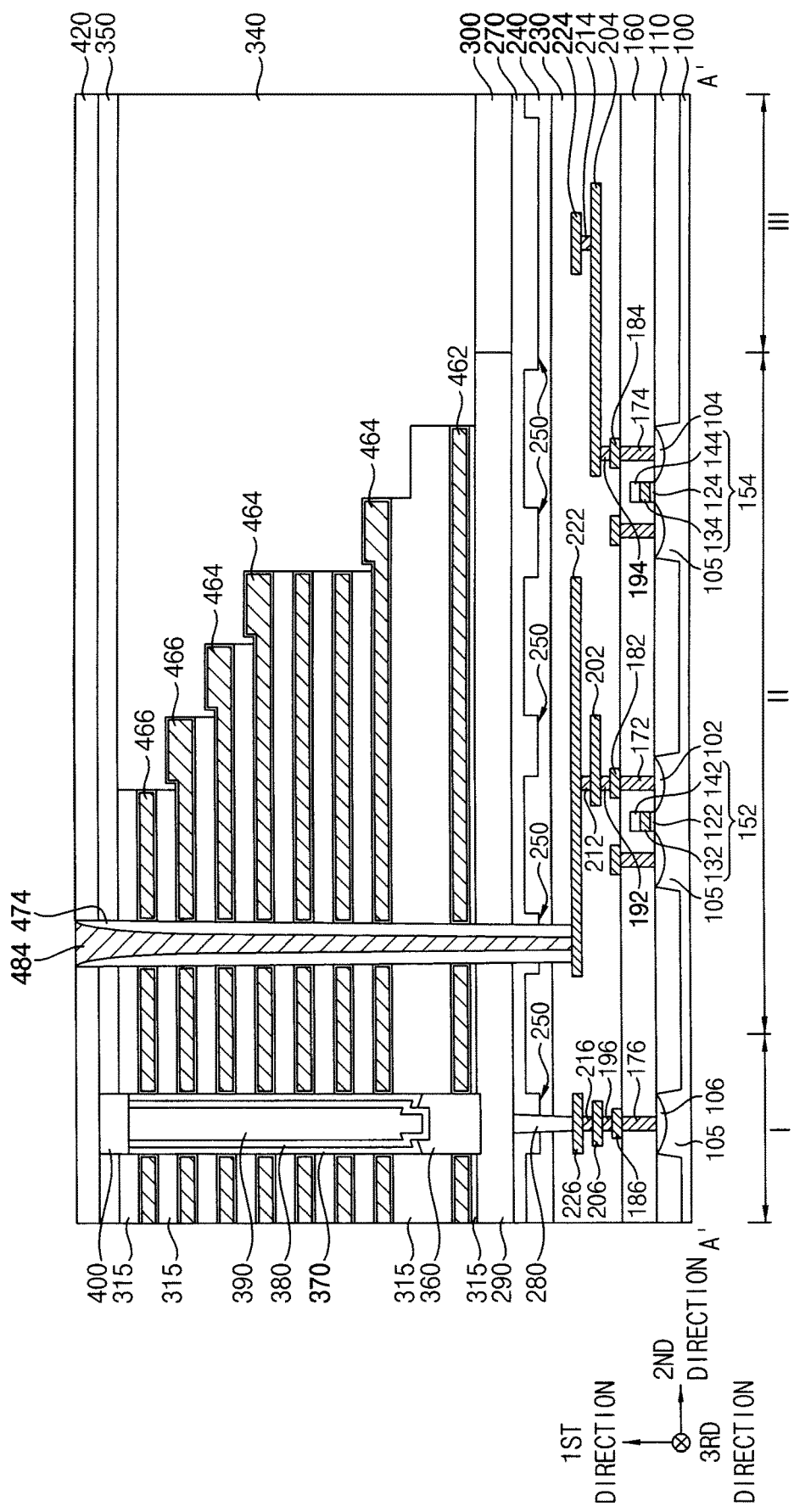

Referring to FIGS. 13 to 15, a sixth insulating interlayer 420 may be formed on the fifth insulating interlayer 350 and the capping pattern 400, a second opening 430 extending through the fifth and sixth insulating interlayers 350 and 420, the insulation layers 310, the sacrificial layers 320, the second substrate 290, the first buffer layer 270, the first bending prevention layer 240 and the second insulating interlayer 230 may be formed to expose an upper surface of the seventh lower wiring 222, and a second contact plug structure may be formed to fill the second opening 430.

The second contact plug structure may be formed by forming a second spacer layer on a sidewall of the second opening 430, the upper surface of the seventh lower wiring 222 exposed by the second opening 430, and an upper surface of the sixth insulating interlayer 420, anisotropically etching the second spacer layer to form a second spacer 474 on the sidewall of the second opening 430, forming a second contact plug layer on the second spacer 474, the seventh lower wiring 222 and the sixth insulating interlayer 420 to fill a remaining portion of the second opening 430, and planarizing the second contact plug layer until the upper surface of the sixth insulating interlayer 420 may be exposed. Thus, the second contact plug structure may include a second contact plug 484 and the second spacer 474 covering a sidewall of the second contact plug 484, and the second contact plug 484 may contact the seventh lower wiring 222.

In exemplary embodiments of the inventive concept, the second contact plug structure may extend through and contact the first bending prevention layer 240. However, the sidewall of the second contact plug 484 included in the second contact plug structure may be covered by the second spacer 474 including an insulating material. In this case, no electrical short may be generated between the second contact plug 484 and the first bending prevention layer 240 even if the first bending prevention layer 240 includes a conductive material.

In the drawings, the second contact plug structure extends through the first recess 250 of the first bending prevention layer 240; however, the inventive concept may not be limited thereto. The second contact plug structure may be formed not only on the second region II of the first substrate 100 but also on the first region I of the first substrate 100.

A fourth etching mask may be formed on the sixth insulating interlayer 420 and the second contact plug structure, and a third opening 440 may be formed through the fifth and sixth insulating interlayers 350 and 420, the insulation layers 310 and the sacrificial layers 320 to expose an upper surface of the second substrate 290.

The third opening 440 may extend in the second direction on the first and second regions I and II of the first substrate 100, and a plurality of third openings 440 may be spaced apart from each other in the third direction. The third opening 440 may extend through the mold in the second direction, and the insulation layers 310 may be divided into a plurality of insulation patterns 315 and the sacrificial layers 320 may be divided into a plurality of sacrificial patterns.

After removing the fourth etching mask, the sacrificial patterns exposed by the third opening 440 may be removed to form a gap between the insulation patterns 315 at respective levels. In this case, an outer sidewall of the charge storage structure 370 and a sidewall of the semiconductor pattern 360 may be partially exposed. In exemplary embodiments of the inventive concept, the sacrificial patterns exposed by the third opening 440 may be removed by a wet etching process using an etchant including phosphoric acid or sulfuric acid.

A second blocking layer 450 may be formed on a sidewall of the third opening 440, the exposed outer sidewall of the charge storage structure 370, the exposed sidewall of the semiconductor pattern 360, an inner wall of the gap, an upper surface of the second substrate 290 and an upper surface of the sixth insulating interlayer 420, and a conductive layer may be formed on the second blocking layer 450 to fill a remaining portion of the gap. A barrier layer may be further formed between the second blocking layer 450 and the conductive layer formed on the second blocking layer 450.

Portions of the conductive layer in the third opening 440 and the third gap adjacent thereto may be removed to form a conductive pattern in the gap. As described above, when the barrier layer is further formed, a barrier pattern covering lower and upper surfaces and a sidewall of the conductive pattern may be further formed.

In exemplary embodiments of the inventive concept, the conductive pattern may extend in the second direction on the first and second regions I and II of the first substrate 100, and a plurality of first conductive patterns may be formed in the third direction.

In exemplary embodiments of the inventive concept, the conductive pattern may include first, second and third gate electrodes 462, 464 and 466 sequentially stacked in the first direction.

Figure 16:
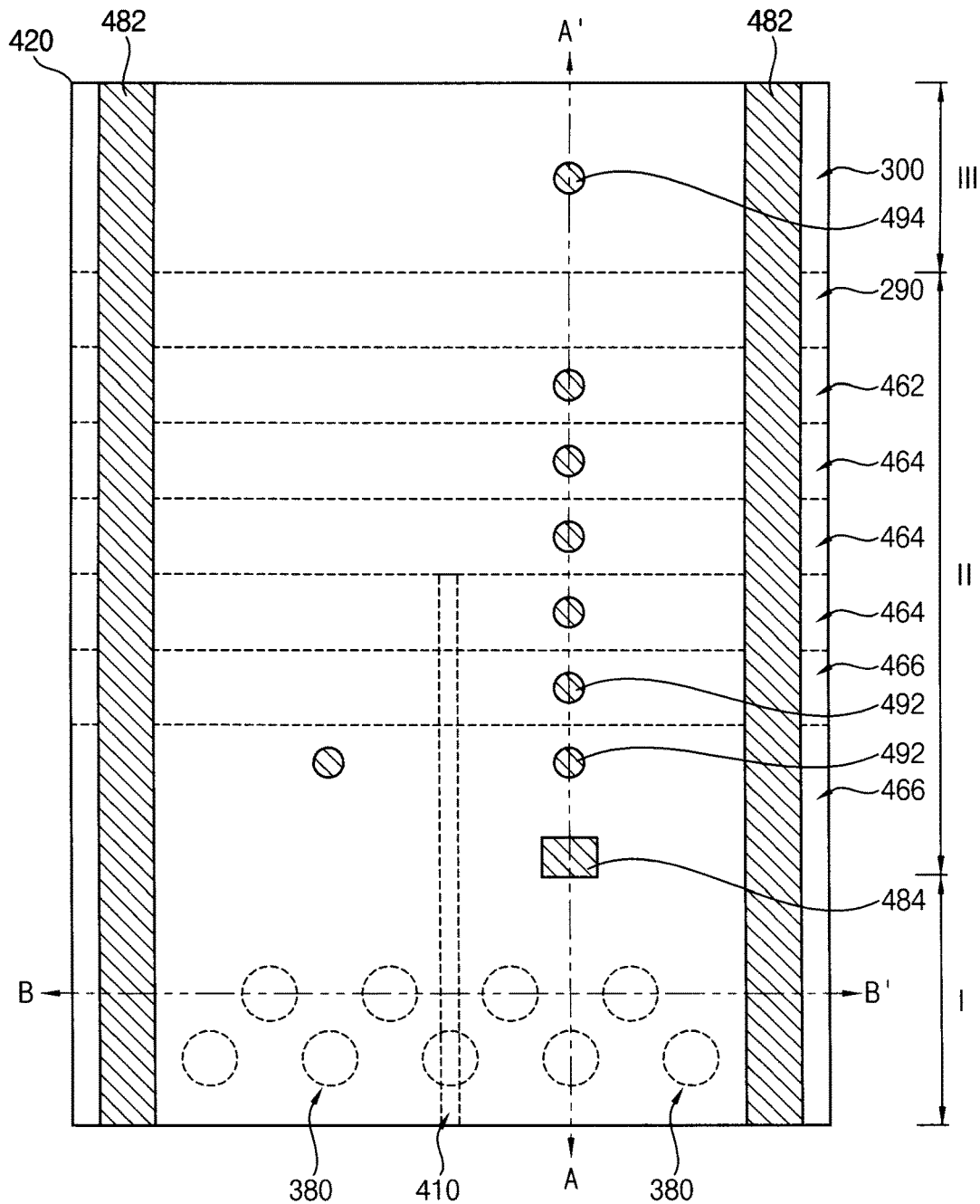

Referring to FIGS. 16 to 18, a fourth impurity region 292 may be formed at an upper portion of the second substrate 290 exposed by the third opening 440, a third spacer 472 may be formed on a sidewall of the third opening 440, and a common source line (CSL) 482 may be formed to fill a remaining portion of the third opening 440.

The third spacer 472 may be formed by forming a third spacer layer on the exposed upper surface of the second substrate 290, the sidewall of the third opening 440 and the upper surface of the sixth insulating interlayer 420, and anisotropically etching the third spacer layer to be formed on the sidewall of the third opening 440. The CSL 482 may be formed by forming a CSL layer on the upper surface of the second substrate 290 exposed by the third opening 440, the third spacer 472 and the sixth insulating interlayer 420, and planarizing the CSL layer until the upper surface of the sixth insulating interlayer 420 may be exposed.

In exemplary embodiments of the inventive concept, the CSL 482 may extend in the second direction to divide each of the first to third gate electrodes 462, 464 and 466 at the same level in the third direction.

A third contact plug 492 extending through the fourth to sixth insulating interlayers 340, 350 and 420, the insulation patterns 315 and the second blocking layer 450 to contact one of the first to third gate electrodes 462, 464 and 466 may be formed on the second region II of the first substrate 100, and a fourth contact plug 494 extending through the second, fourth, fifth and sixth insulating interlayers 230, 240, 350 and 420, the third insulating interlayer pattern 300, the first buffer layer 270 and the first bending prevention layer 240 to contact the eighth lower wiring 224 may be formed on the third region III of the first substrate 100.

The third contact plug 492 may contact an end portion in the second direction of each of the first to third gate electrodes 462, 464 and 466, in other words, a conductive pad thereof.

In exemplary embodiments of the inventive concept, the fourth contact plug 494 may extend through and contact the first bending prevention layer 240. However, when the first bending prevention layer 240 includes a conductive material, the first contact plug 280 may extend through but may not contact the first bending prevention layer 240. In this case, an additional insulation spacer may be formed to cover a sidewall of the fourth contact plug 494, or the fourth contact plug 494 may be spaced apart from a sidewall of the first bending prevention layer 240.

In the drawings, the fourth contact plug 494 extends through the first recess 250 of the first bending prevention layer 240; however, the inventive concept may not be limited thereto.

Referring to FIGS. 2 and 3 again, seventh to twelfth insulating interlayers 500, 520, 540, 560, 580 and 600 may be sequentially formed on the sixth insulating interlayer 420, the CSL 482, the second contact plug structure, and the third and fourth contact plugs 492 and 494, and first to fifth upper contact plugs 512, 514, 516, 517 and 518, first to thirteenth upper wirings 532, 534, 536, 537, 538, 572, 574, 576, 577, 578, 614, 616 and 617, and first to eighth upper vias 552, 554, 556, 558, 594, 596 and 597 may be formed to complete the fabrication of the vertical memory device.

As described above, the first bending prevention layer 240 may be formed between the second insulating interlayer 230 and the second substrate 290 on the first to third regions I, II and III of the first substrate 100, so that the bending of the first substrate 100 may be reduced or prevented. The first bending prevention layer 240 may include the pattern at the upper portion thereof, which may extend in a specific direction, e.g., the third direction. Thus, the first bending prevention layer 240 may apply a compressive or tensile stress in the direction to the first substrate 100, so that upward or downward bending of the first substrate 100 may be reduced or prevented.

Figure 19:
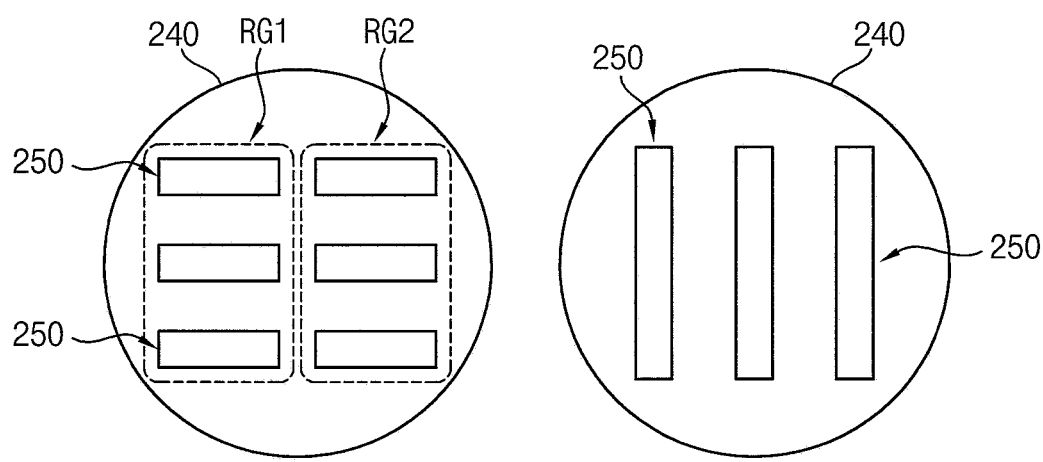
FIG. 19 is a plan view illustrating layouts of a first recess at an upper portion of a first bending prevention layer in accordance with exemplary embodiments of the inventive concept.
Figure 19:
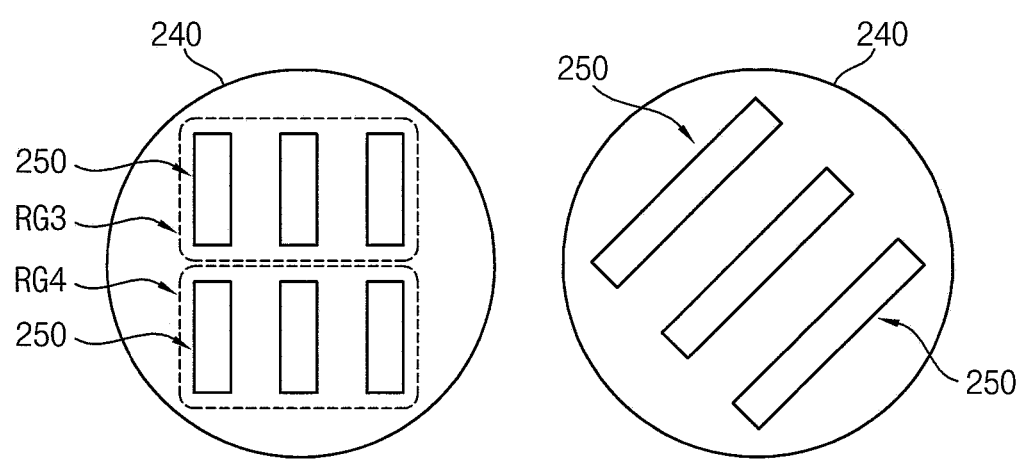
Figure 19:
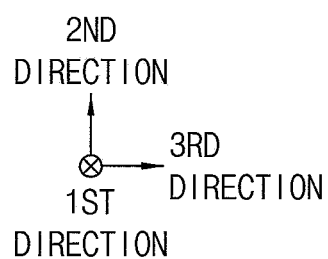

FIG. 19 is a plan view illustrating layouts of the first recess 250 at the upper portion of the first bending prevention layer 240 in accordance with exemplary embodiments of the inventive concept.

Referring to the upper left hand corner of FIG. 19, in an exemplary embodiment of the inventive concept, a first recess group RG1 including a plurality of first recesses 250, each of which may extend in the third direction, spaced apart from each other in the second direction and a second recess group RG2 spaced apart from the first recess group RG1 in the third direction and including a plurality of first recesses 250, each of which may extend in the third direction, spaced apart from each other in the second direction may be formed at upper portions of the first bending prevention layer 240. Each of the first recesses 250 is a pattern at the upper portion of the first bending prevention layer 240, and thus, the first and second recess groups may be referred to as first and second pattern groups, respectively.

In another exemplary embodiment of the inventive concept shown in the upper right hand corner of FIG. 19, a plurality of first recesses 250, each of which may extend in the second direction, spaced apart from each other in the third direction may be formed at upper portions of the first bending prevention layer 240.

In another exemplary embodiment of the inventive concept shown in the lower left hand corner of FIG. 19, a third recess group RG3 including a plurality of first recesses 250, each of which may extend in the second direction, spaced apart from each other in the third direction and a fourth recess group RG4 spaced apart from the third recess group RG3 in the second direction and including a plurality of first recesses 250, each of which may extend in the second direction, spaced apart from each other in the third direction may be formed at upper portions of the first bending prevention layer 240. The third and fourth recess groups may be referred to as third and fourth pattern groups, respectively.

In another exemplary embodiment of the inventive concept shown in the lower right hand corner of FIG. 19, a plurality of first recesses 250, each of which may extend in a fourth direction making an acute angle with the second direction that may be an extension direction of each of the gate electrodes 462, 464 and 466 or the third direction substantially perpendicular to the second direction, spaced apart from each other in a fifth direction crossing the fourth direction may be formed at upper portions of the first bending prevention layer 240.

On the first bending prevention layer 240 in the vertical memory device, the first recesses 250 may have the layouts shown in FIG. 19. However, the first bending prevention layer 240 may have various types of layouts, so that a stress may be applied to the first substrate 100 to reduce or prevent the bending of the first substrate 100.

FIGS. 20 to 26 are cross-sectional views illustrating vertical memory devices in accordance with exemplary embodiments of the inventive concept. The vertical memory devices may be substantially the same as or similar to that of FIGS. 1 to 4, except for the bending prevention layer. Thus, like reference numerals may refer to like elements, and detailed descriptions thereon may be omitted.

Figure 20:
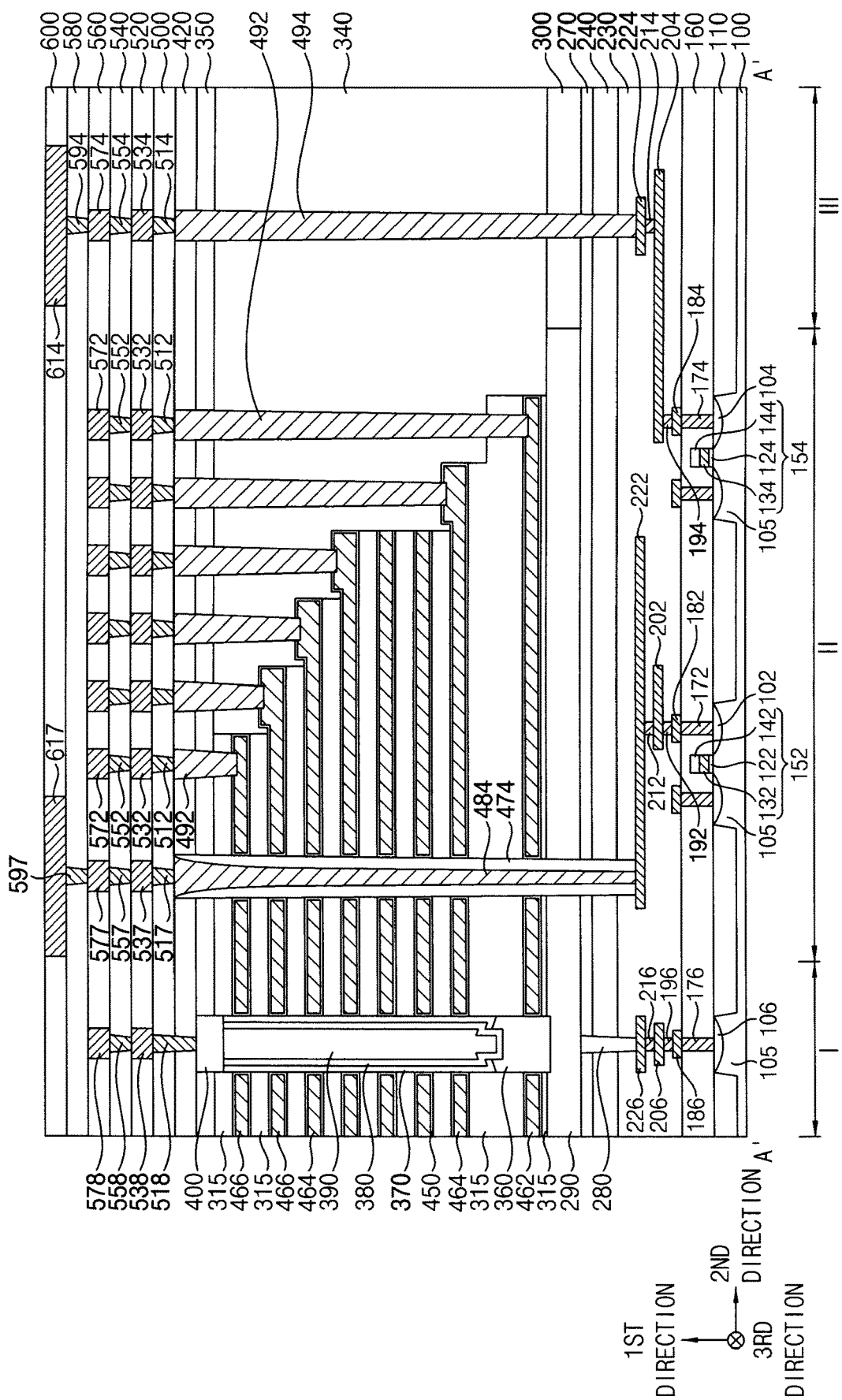
FIGS. 20, 21, 22A, 22B, 23, 24, 25 and 26 are cross-sectional views illustrating vertical memory devices in accordance with exemplary embodiments of the inventive concept.

Referring to FIG. 20, the first bending prevention layer 240 may have no pattern, and in this case, the entire first bending prevention layer 240 may apply a compressive or tensile stress to the first substrate 100, to reduce or prevent the bending of the first substrate 100. In FIG. 20, the first bending prevention layer 240 may be formed with a flat upper surface.

Figure 21:
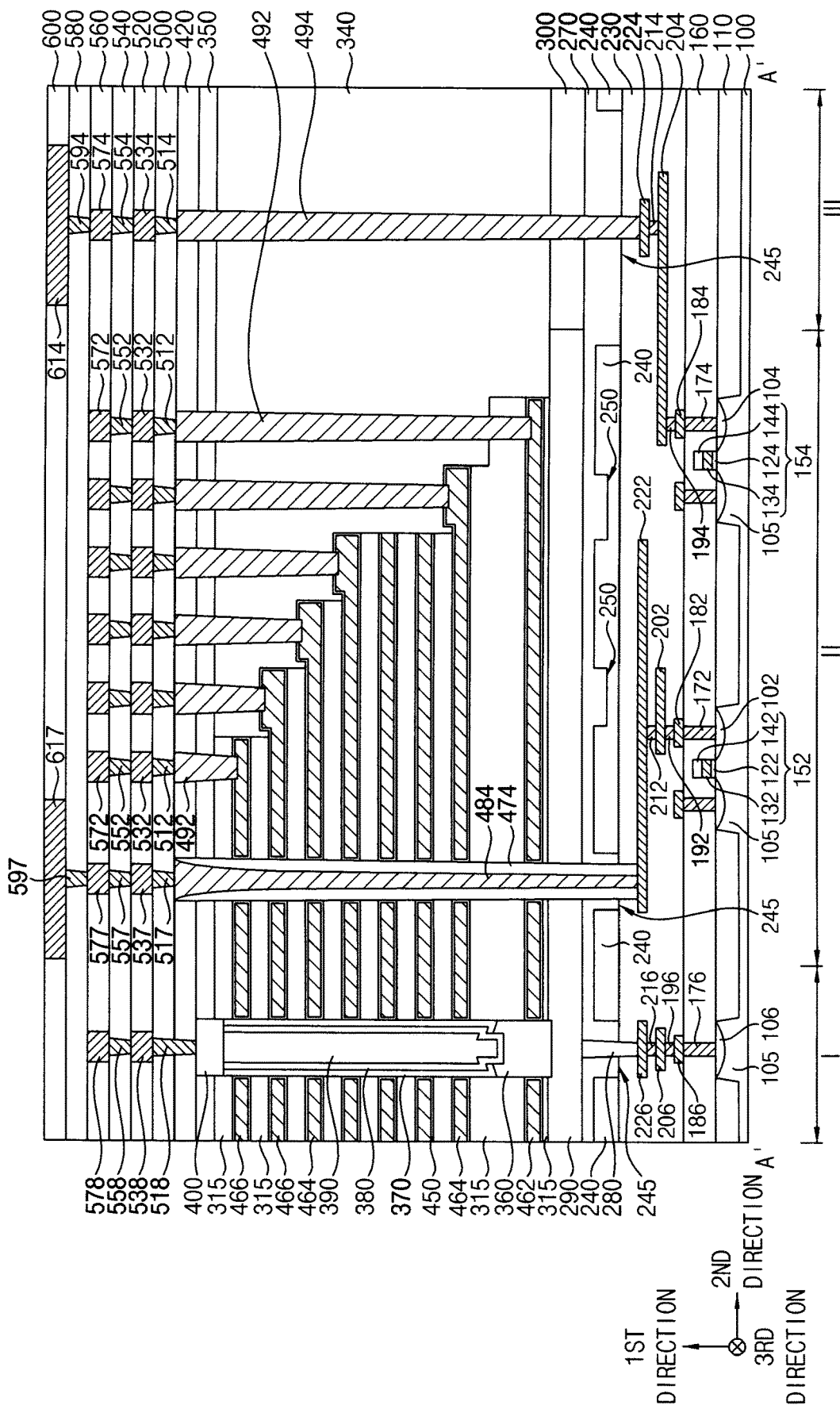
Figure 22A:
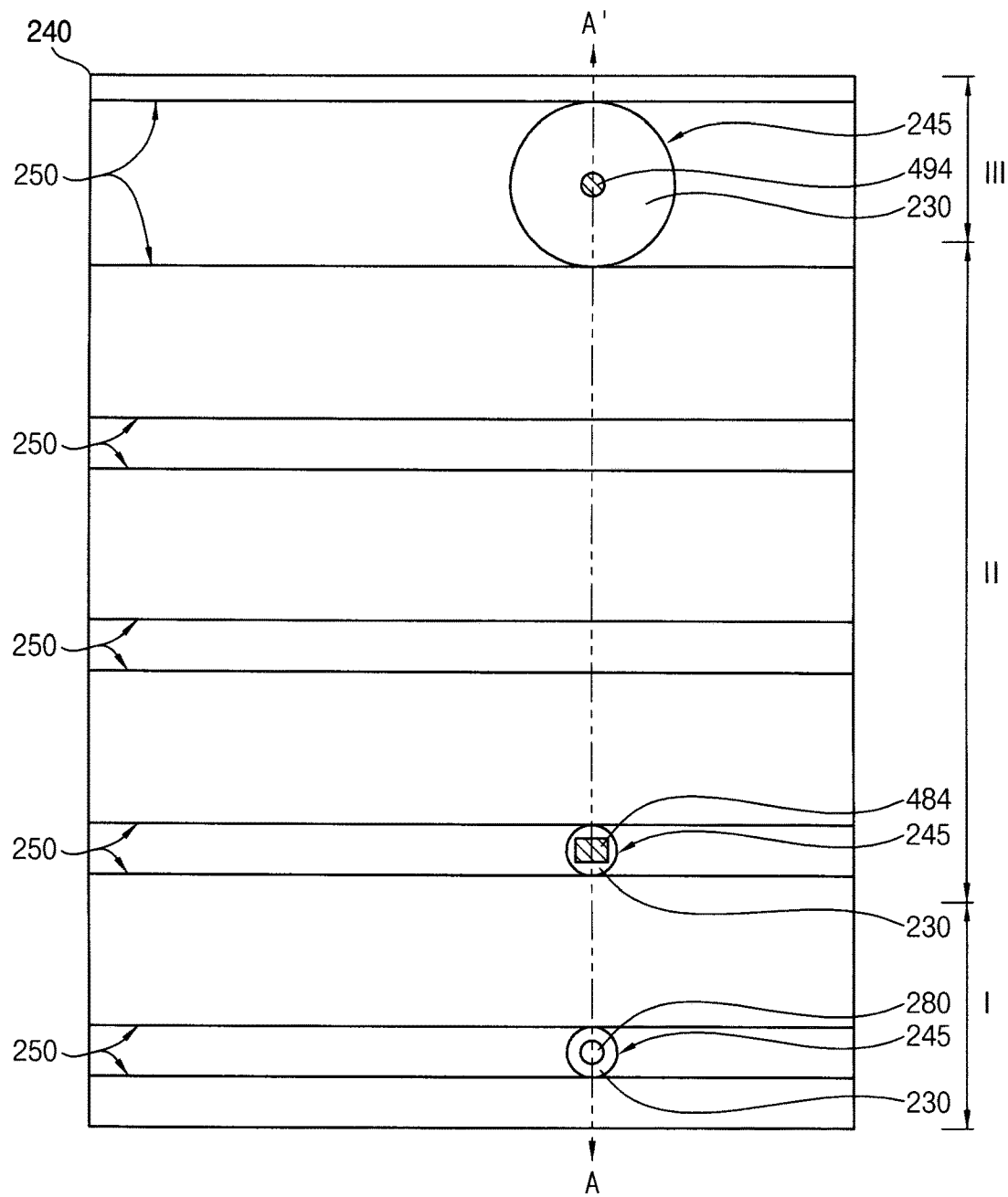

Referring to FIGS. 21 and 22A, each of the first, second and fourth contact plugs 280, 484 and 494 may pass by a fourth opening 245 extending through the first bending prevention layer 240. The fourth opening 245 may have a diameter greater than those of the first, second and fourth contact plugs 280, 484 and 494, and thus, each of the first, second and fourth contact plugs 280, 484 and 494 may extend through but not contact the first bending prevention layer 240. Although FIG. 21 shows the fourth opening 245 being formed in the first bending layer 240 having recesses 250, the fourth opening 245 may be formed in the first bending layer 240 of FIG. 20.

Figure 22B:
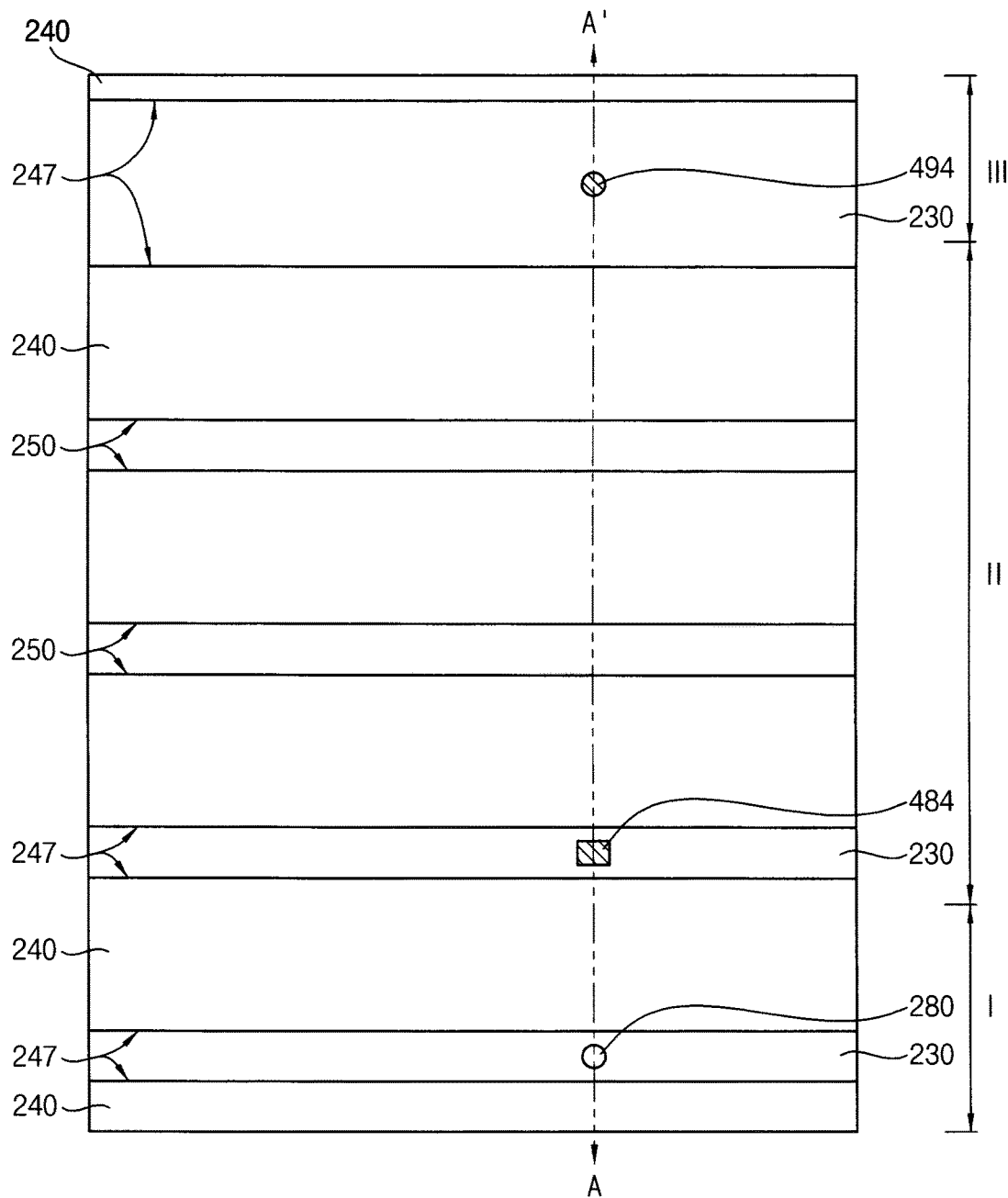
Figure 22B:
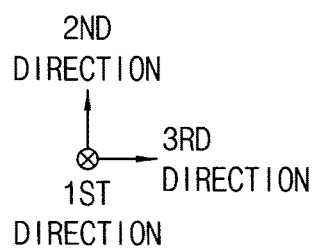

Referring to FIGS. 21 and 22B, the first bending prevention layer 240 may be divided into a plurality of pieces by a fifth opening 247 extending therethrough in the third direction, and each of the first, second and fourth contact plugs 280, 484 and 494 may pass by the fifth opening 247. Thus, each of the first, second and fourth contact plugs 280, 484 and 494 may be spaced apart from the first bending prevention layer 240 so as not to contact the first bending prevention layer 240.

Figure 23:
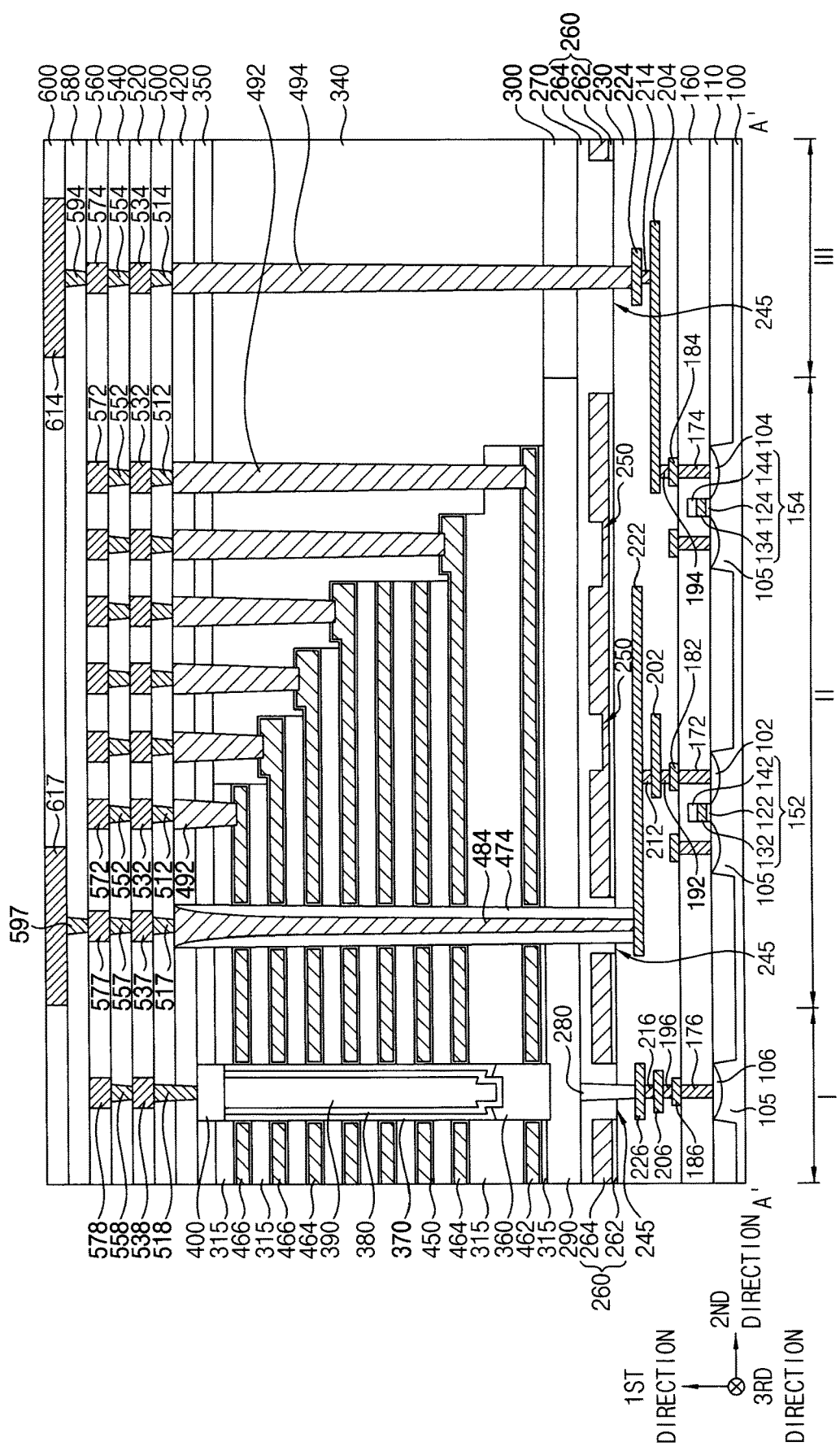

Referring to FIG. 23, a second bending prevention layer 260 including an adhesion pattern 262 and a metal pattern 264 sequentially stacked may be formed, instead of the first bending prevention layer 240 that is a single layer. The adhesion pattern 262 may include, e.g., a metal nitride, and the metal pattern 264 may include, e.g., a metal. The second bending prevention layer 260 includes a conductive material, and thus, may have one of the structures illustrated with reference to FIGS. 21, 22A and 22B. The second bending prevention layer 260 may also be formed to have a flat upper surface.

Figure 24:
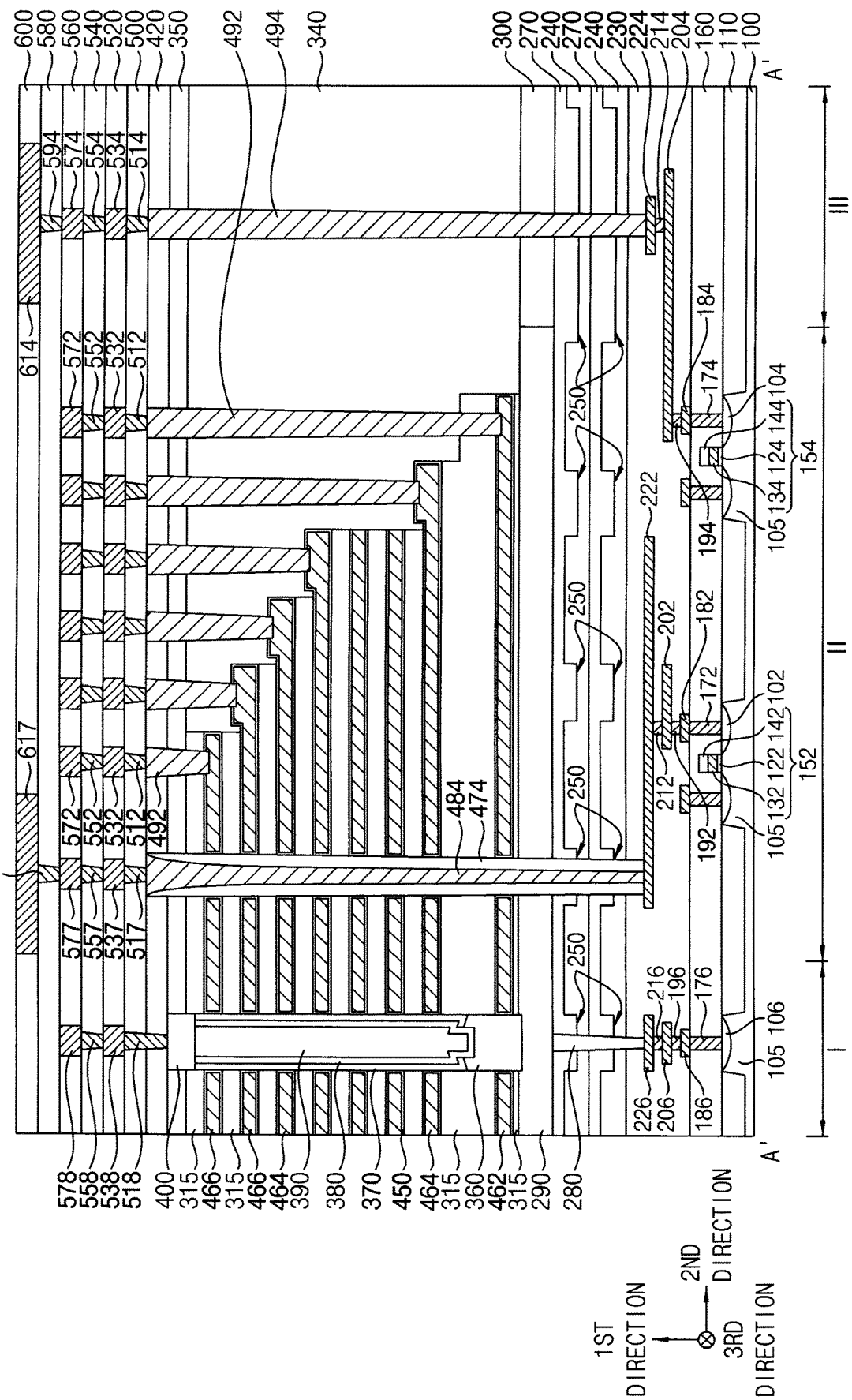

Referring to FIG. 24, a plurality of first bending prevention layers 240 may be formed in the first direction between the lower insulating interlayer structure and the second substrate 290. The first bending prevention layers 240 may have patterns extending in the same direction or different directions. A first buffer layer 270 may be formed between the first bending prevention layers 240.

Figure 25:
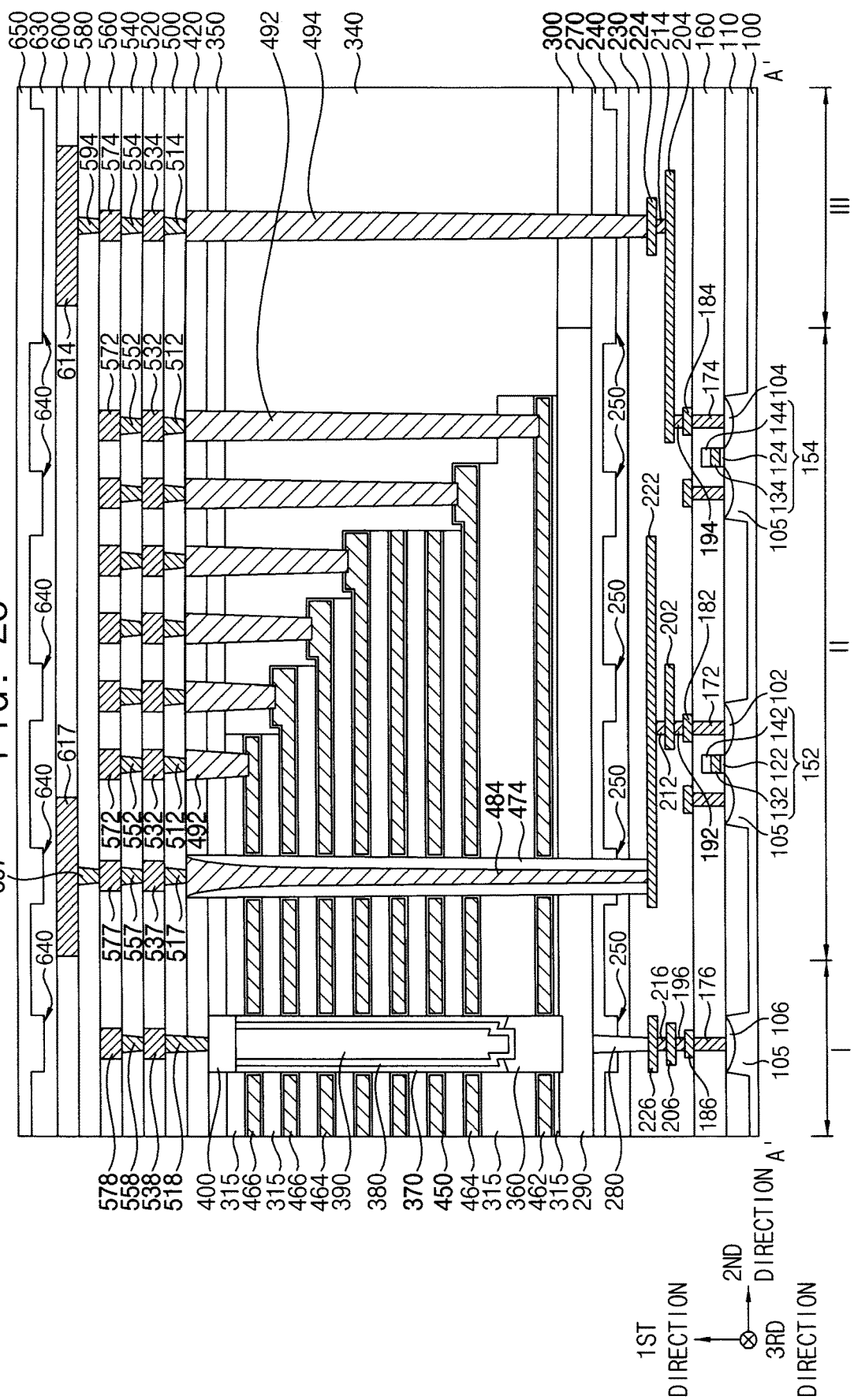

Referring to FIG. 25, a third bending prevention layer 630 may be further formed on the upper circuit pattern, in addition to the first bending prevention layer 240. A second recess 640 may be formed on the third bending prevention layer 630, and a second buffer layer 650 may be formed on the third bending prevention layer 630 to cover the second recess 640. In some exemplary embodiments of the inventive concept, the first bending prevention layer 240 may not be formed, and only the third bending prevention layer 630 may be formed. In other exemplary embodiments of the inventive concept, the third bending prevention layer 630 may not include a second recess.

Figure 26:
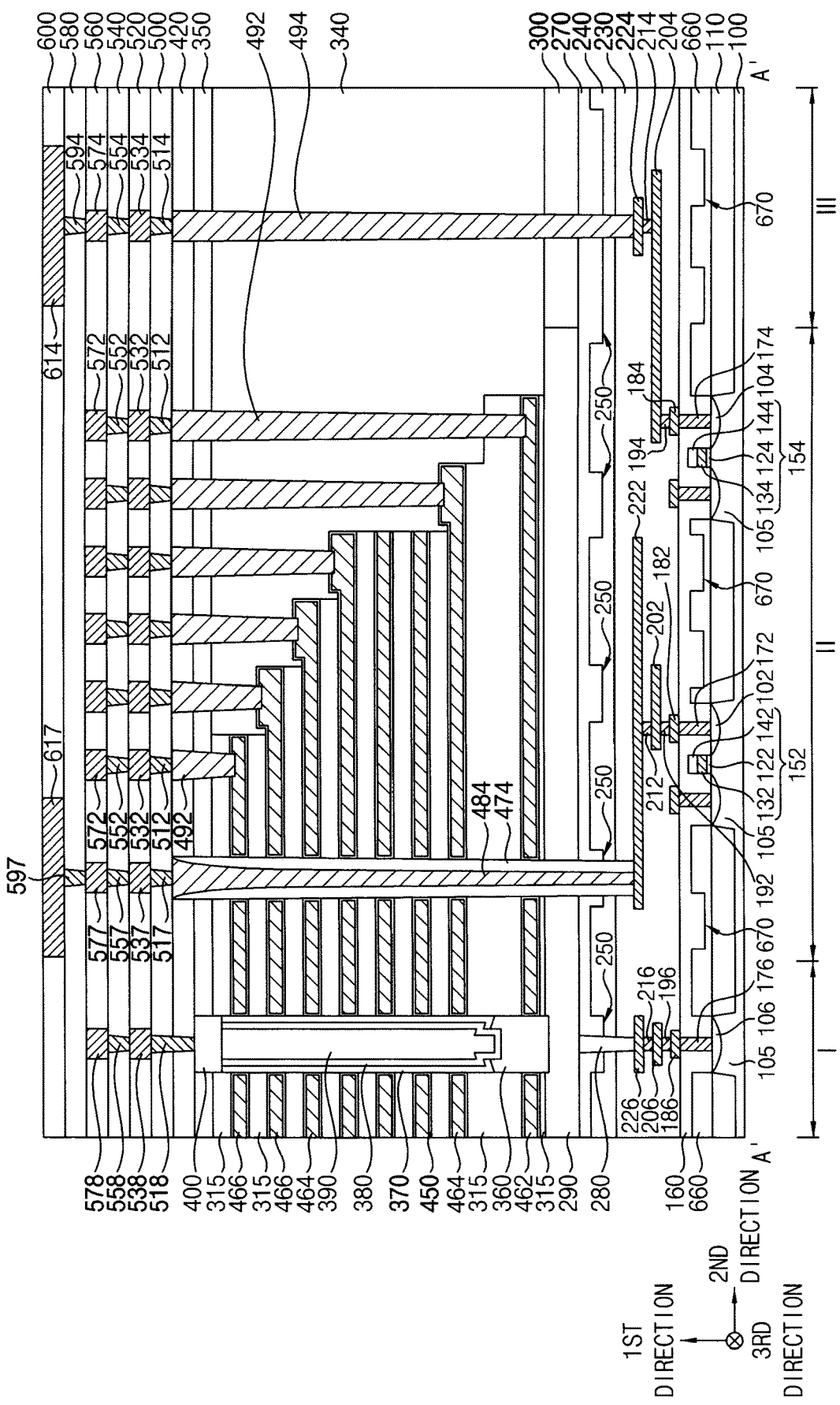

Referring to FIG. 26, a fourth bending prevention layer 660 may be further formed on the first substrate 100, in addition to the first bending prevention layer 240. A third recess 670 may be formed on the fourth bending prevention layer 630, and the first insulating interlayer 160 may cover the third recess 670. In some exemplary embodiments of the inventive concept, the first bending prevention layer 240 may not be formed, and only the fourth bending prevention layer 660 may be formed.

The fourth bending prevention layer 660 may have one of the structures illustrated with reference to FIGS. 21, 22A and 22B, so that the first and second transistors and the third impurity region 106 may extend through but not contact the fourth bending prevention layer 660.

Figure 27:
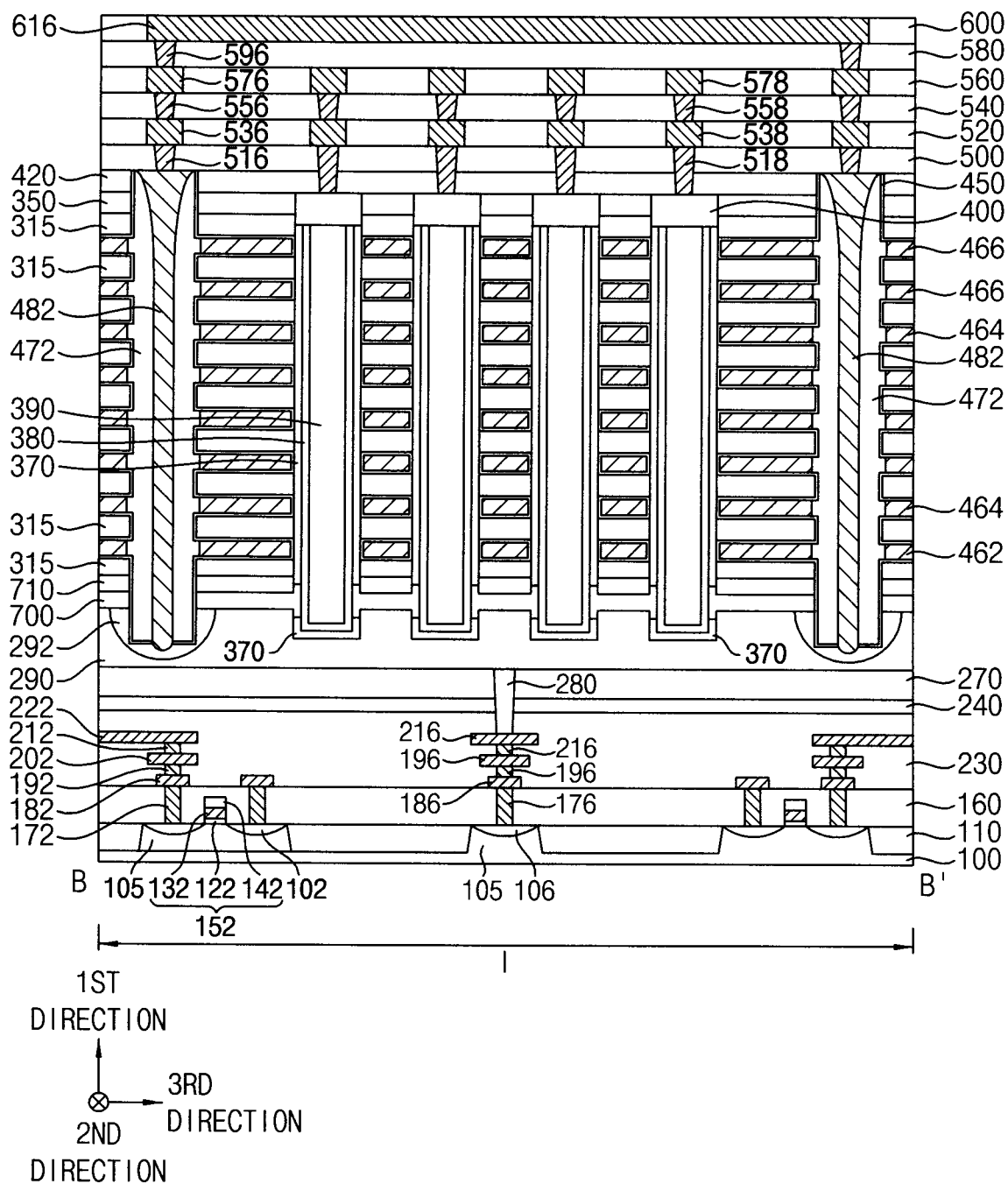
FIG. 27 is a cross-sectional view illustrating a vertical memory device in accordance with exemplary embodiments of the inventive concept.

FIG. 27 is a cross-sectional view illustrating a vertical memory device in accordance with exemplary embodiments of the inventive concept. The vertical memory device may be substantially the same as or similar to that of FIGS. 1 to 4, except some elements. Thus, like reference numerals may refer to like elements, and detailed descriptions thereon may be omitted.

Referring to FIG. 27, a channel connection pattern 700 and a support layer 710 may be sequentially formed on the second substrate 290, and the insulation pattern 315 and the gate electrodes 462, 464 and 466 may be alternately and repeatedly stacked on the support layer 710.

The channel connection pattern 700 may connect the channels 380 in the same memory cell block, and may include, e.g., doped polysilicon. Thus, the charge storage structure 370 may be divided at a lower portion of each of the channels 380 to expose an outer sidewall of each of the channels 380, and the exposed outer sidewalls of the channels 380 may contact the channel connection pattern 700. An upper portion of the charge storage structure 370 may cover an outer sidewall of an upper portion of each of the channels 380, and a lower portion of the charge storage structure 370 may be formed on the second substrate 290 to cover a bottom surface and an outer sidewall of a lower portion of each of the channels 380.

The support layer 710 may include undoped or doped polysilicon.

The vertical memory device in accordance with exemplary embodiments of the inventive concept may include the bending prevention layer between an upper substrate and the lower insulating interlayer structure covering the lower circuit pattern, or on the upper circuit pattern, or on a lower substrate. Thus, the bending of the lower substrate may be reduced or prevented by the pattern extending along an upper portion of the bending prevention layer. Therefore, exemplary embodiments of the inventive concept provide a vertical memory device having uniform electrical characteristics.

While the present inventive concept has been shown and described with reference to exemplary embodiments thereof, those skilled in the art will readily appreciate that many modifications may be made thereto without departing from the scope of the present inventive concept.

What is claimed is:
1. A vertical memory device, comprising:
a circuit pattern on a first substrate;
an insulating interlayer on the first substrate, the insulating interlayer covering circuit pattern;

an intermediate insulation layer on the insulating interlayer, the intermediate insulation layer extending in a first direction substantially parallel to an upper surface of the first substrate, and the intermediate insulation layer having a plurality of recesses on an upper surface thereof, wherein each of the plurality of recesses extends in a third direction substantially parallel to the upper surface of the first substrate, and sidewalls of one of the plurality of recesses are spaced apart from a first contact plug extending through the one of the plurality of recesses such that a buffer layer is provided in the recess with the first contact plug;

a second substrate on the intermediate insulation layer;

gate electrodes spaced apart from each other in a second direction on the second substrate, the second direction being substantially perpendicular to the upper surface of the first substrate; and a channel extending through the gate electrodes in the second direction.

2. The vertical memory device of claim 1, wherein the third direction is substantially perpendicular to the first direction.

3. The vertical memory device of claim 2, wherein the plurality of recesses include:

a first group including first recesses spaced apart from each other in the third direction; and a second group including second recesses spaced apart from each other in the third direction, the second group being spaced apart from the first group in the first direction.

4. The vertical memory device of claim 1, wherein each of the gate electrodes extends in the first direction.

5. The vertical memory device of claim 1, wherein each of the gate electrodes extends in the third direction.

6. The vertical memory device of claim 1, wherein the third direction makes an acute angle with the first direction.

7. The vertical memory device of claim 1, wherein each of the plurality of recesses has a bar shape extending in the third direction on the upper surface of the intermediate insulation layer.

8. The vertical memory device of claim 7, wherein the buffer layer is on the intermediate insulation layer, the buffer layer fills the recess and has a flat upper surface.

9. The vertical memory device of claim 1, wherein the intermediate insulation layer is a first intermediate insulation layer, and wherein the vertical memory device further comprises;

wirings on the gate electrodes, the wirings being electrically connected to the gate electrodes; and a second intermediate insulation layer on the wirings.

10. The vertical memory device of claim 1, wherein the intermediate insulation layer is a first intermediate insulation layer, and wherein the vertical memory device further comprises a second intermediate insulation layer between the first substrate and the insulating interlayer.

11. The vertical memory device of claim 1, further comprising a contact plug structure extending in the second direction through the gate electrodes and the second substrate to be electrically connected to the circuit pattern, wherein the contact plug structure includes a contact plug and an insulation spacer covering a sidewall of the contact plug.

12. The vertical memory device of claim 11, wherein the contact plug structure extends through the intermediate insulation layer and contacts the intermediate insulation layer.

13. The vertical memory device of claim 11, wherein the contact plug structure extends between the intermediate insulation layer, is spaced apart from the intermediate insulation layer and does not contact the intermediate insulation layer.

14. The vertical memory device of claim 11, wherein the intermediate insulation layer is a first intermediate insulation layer, the vertical memory device further comprises a second intermediate insulation layer spaced apart from the first intermediate insulation layer in a horizontal direction substantially parallel to the upper surface of the first substrate, and wherein the contact plug structure extends between the first and second intermediate insulation layers, and does not contact the first and second intermediate insulation layers.

15. The vertical memory device of claim 1, wherein the intermediate insulation layer includes first and second layers sequentially stacked, and wherein the first layer includes a metal nitride, and the second layer includes a metal.

16. The vertical memory device of claim 1, wherein the insulating interlayer is a first insulating interlayer, and wherein the vertical memory device further comprises:

an insulating interlayer pattern on the intermediate insulation layer at the same level as the second substrate, the insulating interlayer pattern covering a sidewall of the second substrate;

a second insulating interlayer on the second substrate and the insulating interlayer pattern, the second insulating interlayer covering sidewalls of the gate electrodes; and the first contact plug extending in the second direction through the second insulating interlayer and the insulating interlayer pattern, the first contact plug being electrically connected to the circuit pattern.

17. The vertical memory device of claim 1, further comprising a second contact plug extending in the second direction from a bottom surface of the second substrate to be electrically connected to the circuit pattern.

18. A vertical memory device, comprising:

a circuit pattern on a first substrate, the first substrate including a cell region and a peripheral circuit region adjacent to the cell region;

a first insulating interlayer on the first substrate, the first insulating interlayer covering the circuit pattern;

a first intermediate insulation layer on the first insulating interlayer on the cell region and the peripheral circuit region, the first intermediate insulation layer having at least one recess on an upper surface thereof;

a second substrate on the first intermediate insulation layer on the cell region;

gate electrodes spaced apart from each other in a first direction on the second substrate on the cell region, the first direction substantially perpendicular to an upper surface of the first substrate;

a channel extending through the gate electrodes in the first direction on the cell region; and a first contact plug extending in the first direction through the first intermediate insulation layer and the first insulating interlayer on the peripheral circuit region, the first contact plug being electrically connected to the circuit pattern, wherein the first intermediate insulation layer includes a plurality of patterns spaced apart from each other in a direction substantially parallel to an upper surface of the first substrate and substantially perpendicular to the first direction.

19. A vertical memory device, comprising:
- transistors on a first substrate;
- lower wirings on the first substrate, the lower wirings being electrically connected to the transistors;
- a first insulating interlayer on the first substrate, the first insulating interlayer covering the transistors and the lower wirings;
- an intermediate insulation layer on the first insulating interlayer, the intermediate insulation layer extending in a first direction substantially parallel to an upper surface of the first substrate, and the intermediate insulation layer having at least one recess on an upper surface thereof;
- a second substrate on the intermediate insulation layer;
- gate electrodes spaced apart from each other in a second direction on the second substrate, the second direction being substantially perpendicular to the upper surface of the first substrate;
- a second insulating interlayer on the second substrate, the second insulating interlayer covering sidewalls of the gate electrodes;
- channels extending through the gate electrodes in the second direction;
- upper wirings on the gate electrodes, the upper wirings being electrically connected to the gate electrodes;
- a first contact plug structure extending through the gate electrodes, the second substrate and the intermediate insulation layer, the first contact plug structure being electrically connected to a first lower wiring of the lower wirings; and
- a second contact plug extending through the second insulating interlayer and the intermediate insulation layer, the second contact plug being electrically connected to a second lower wiring of the lower wirings.

20. The vertical memory device of claim 19, wherein the intermediate insulation layer includes a plurality of patterns spaced apart from each other in a third direction substantially parallel to the upper surface of the first substrate and crossing the first direction.

* * * * *